(12) United States Patent
Kerins et al.

(10) Patent No.: US 12,345,792 B2
(45) Date of Patent: Jul. 1, 2025

(54) APPARATUS AND METHOD FOR REPRESENTING ORGANIZED TISSUE AND CONSTRUCTING CONFIGURABLE PHANTOMS OF SAME

(71) Applicant: Preoperative Performance Inc., Toronto (CA)

(72) Inventors: Fergal Kerins, Toronto (CA); Murugathas Yuwaraj, Markham (CA)

(73) Assignee: Preoperative Performance Inc., Toronto (CA)

( * ) Notice: Subject to any disclaimer, the term of this patent is extended or adjusted under 35 U.S.C. 154(b) by 56 days.

(21) Appl. No.: 18/032,127

(22) PCT Filed: Oct. 18, 2021

(86) PCT No.: PCT/CA2021/051462
§ 371 (c)(1),
(2) Date: Apr. 14, 2023

(87) PCT Pub. No.: WO2022/077125
PCT Pub. Date: Apr. 21, 2022

(65) Prior Publication Data
US 2024/0019516 A1    Jan. 18, 2024

Related U.S. Application Data

(60) Provisional application No. 63/093,283, filed on Oct. 18, 2020.

(51) Int. Cl.
*G01R 33/58* (2006.01)
*G01R 33/563* (2006.01)

(52) U.S. Cl.
CPC ....... *G01R 33/58* (2013.01); *G01R 33/56341* (2013.01); *G01R 33/56366* (2013.01)

(58) Field of Classification Search
CPC .............. G01R 33/58; G01R 33/56341; G01R 33/56366
See application file for complete search history.

(56) References Cited

U.S. PATENT DOCUMENTS

2006/0195030 A1\* 8/2006 Ogrezeanu ............. A61B 5/055
600/419
2009/0316972 A1  12/2009 Borenstein et al.
(Continued)

FOREIGN PATENT DOCUMENTS

| CN | 103356194 B | 1/2015 |
| WO | 2017035626 A1 | 3/2017 |

OTHER PUBLICATIONS

Caroli et al., "Diffusion-weighted magnetic resonance imaging to assess diffuse renal pathology: a systematic review and statement paper" Nephrology Dialysis Transplantation (2018) 33: ii29-40 (12 pages).
(Continued)

*Primary Examiner* — G. M. A Hyder
(74) *Attorney, Agent, or Firm* — SMART & BIGGAR LP; Tonino Rosario Orsi

(57) ABSTRACT

Components and construction methods are described for constructing a wide variety of configurable phantoms for use in MR imaging. These phantoms generally comprise an outer housing; at least one support plate disposed within the outer housing and having a plurality of locations for selectively receiving at least one element allowing for configurable phantoms to be created; the at least one element having anisotropic diffusion, isotropic diffusion, and/or perfusion characteristics, the at least one element being releasably connected at one of the plurality of locations on the support plate; and a matrix material contained within the outer housing, the matrix material being an aqueous fluid, wherein during MR imaging, the presence of the aqueous fluid, and directionality of fluid molecular diffusion within or through the at least one element are recorded in MR images.

24 Claims, 17 Drawing Sheets

(56) References Cited

U.S. PATENT DOCUMENTS

| | | |
|---|---|---|
| 2014/0266198 A1 | 9/2014 | Tadic et al. |
| 2017/0192076 A1* | 7/2017 | Kerins .................. G09B 23/30 |
| 2018/0113186 A1 | 4/2018 | Kerins et al. |
| 2018/0275240 A1 | 9/2018 | Kim |
| 2018/0335498 A1 | 11/2018 | Attariwala |

OTHER PUBLICATIONS

International Search Report and Written Opinion mailed Jan. 28, 2022 in International Patent Application No. PCT/CA2021/051462 (9 pages).

Fan and Shen "Case Report: Assessment of Renal Allograft Function with DTI and Tractography" (2014) Magnetom Flash pp. 28-30 (3 pages).

Keenan et al., "Design of a breast phantom for quantitative MRI : Design of a Breast Phantom", Journal of Magnetic Resonance Imaging, vol. 44, No. 3, Mar. 7, 2016 (Mar. 7, 2016), pp. 610-619 (10 pages).

Souza Edna Marina De et al., "Investigation of anisotropic fishing line-based phantom as tool in quality control of diffusion tensor imaging", Radiological Physics and Technology, vol. 12, No. 2, Mar. 16, 2019 (Mar. 16, 2019), pp. 161-171 (11 pages).

Extended European Search Report dated Jan. 9, 2025 in European Patent Application No. 21878842.0 (21 pages).

\* cited by examiner

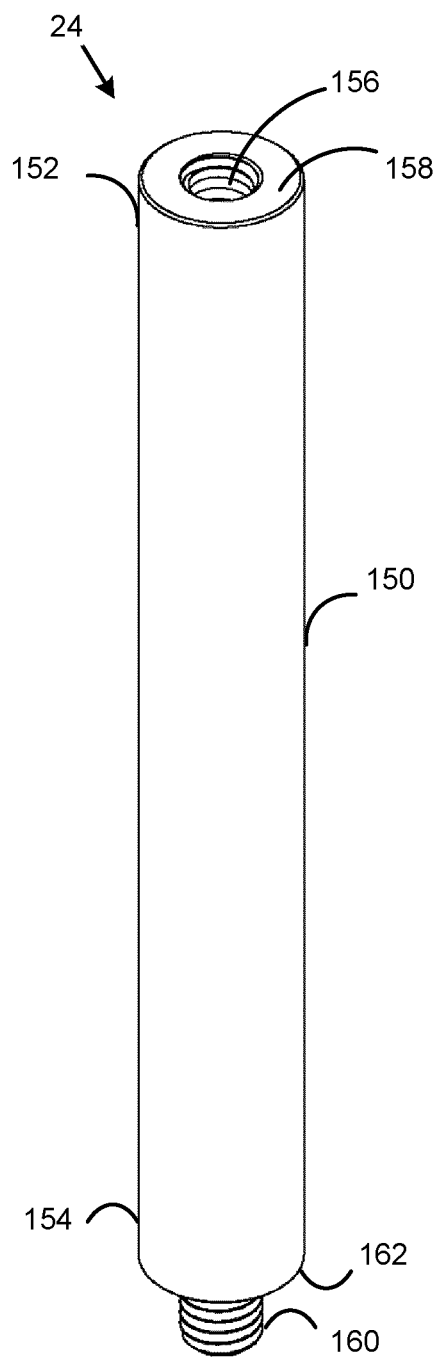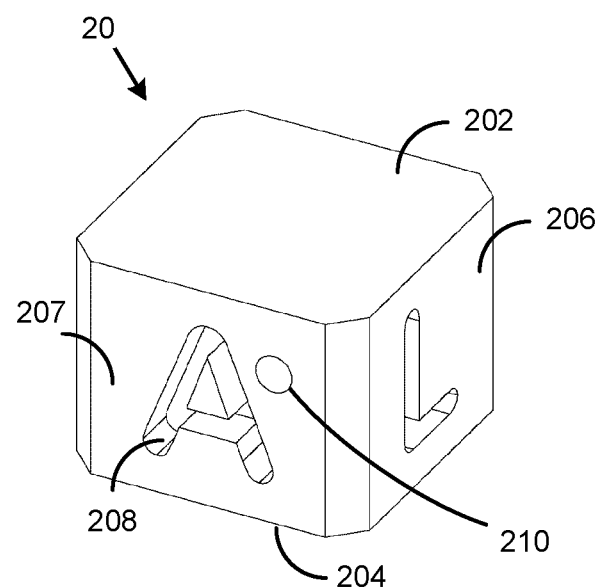
FIG. 4
FIG. 5

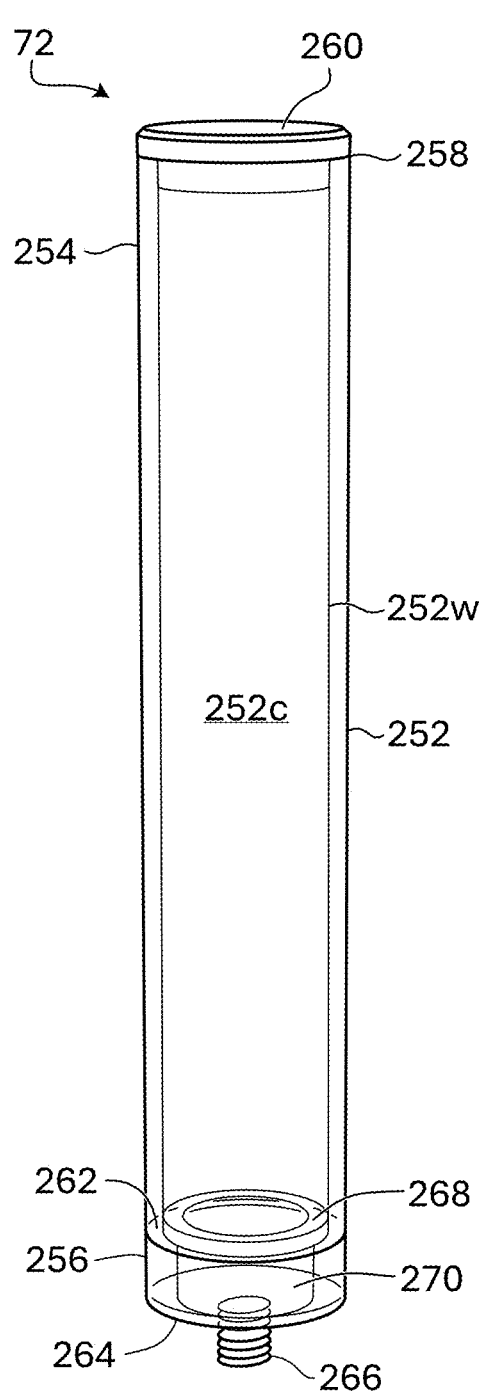 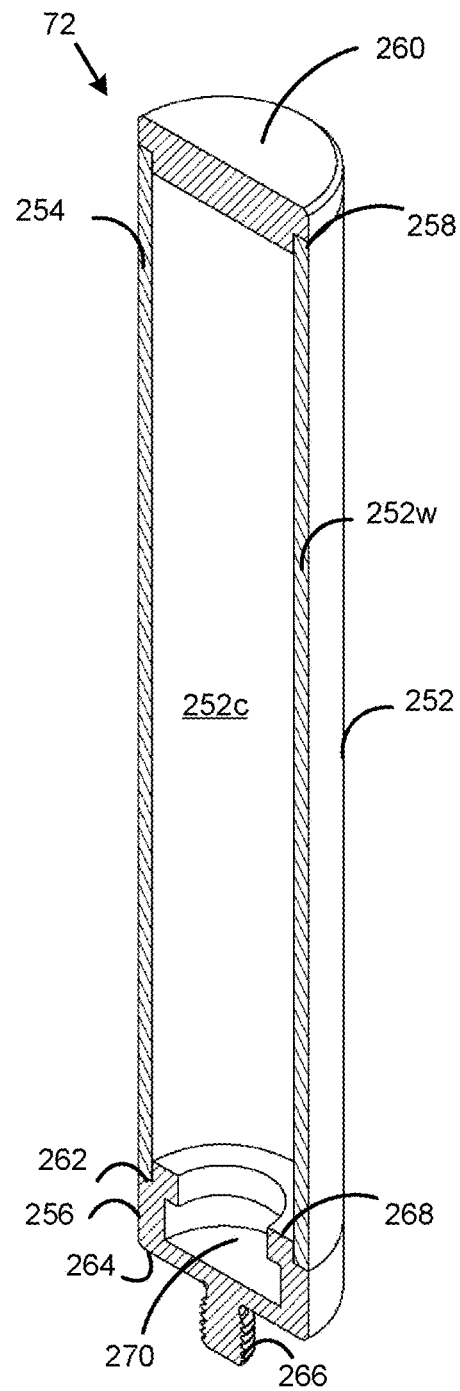
FIG. 6A  FIG. 6B

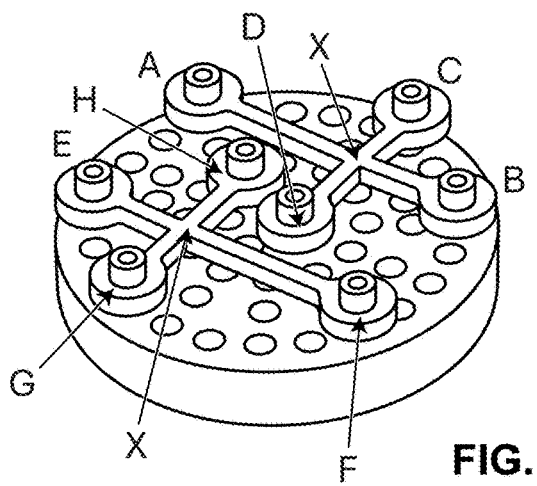
FIG. 11C
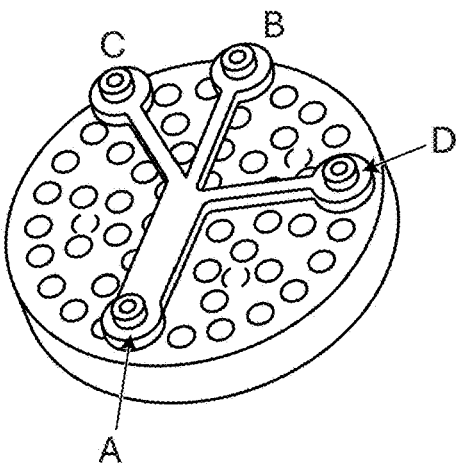
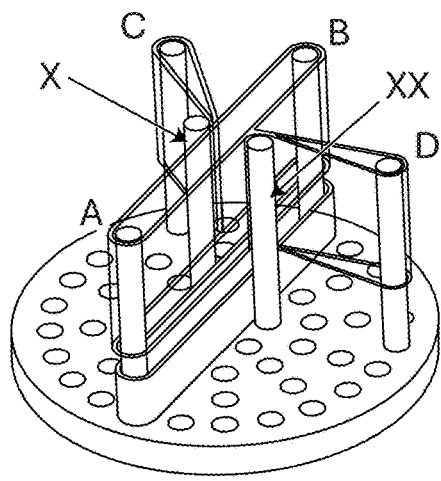
FIG. 11D
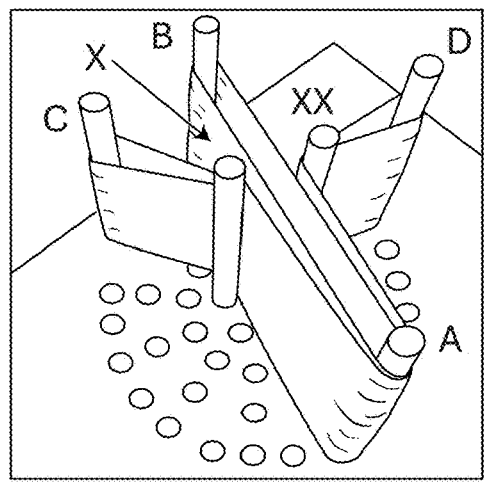
FIG. 11E
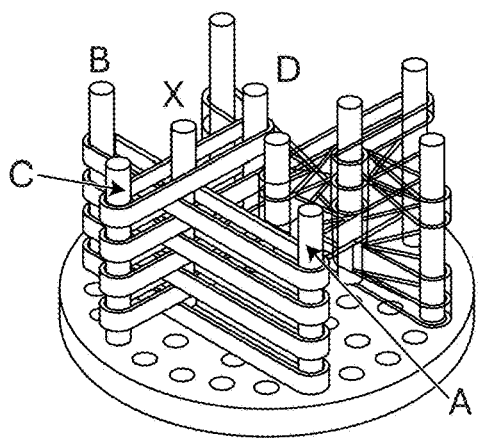
FIG. 11F
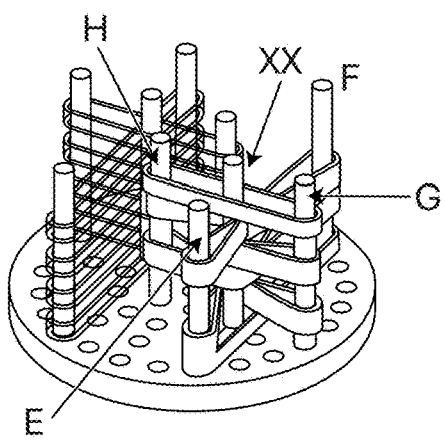
FIG. 11G Corticospinal Tract

APPARATUS AND METHOD FOR REPRESENTING ORGANIZED TISSUE AND CONSTRUCTING CONFIGURABLE PHANTOMS OF SAME

CROSS-REFERENCE TO RELATED APPLICATIONS

This application is a national phase entry of PCT/CA2021/051462 filed Oct. 18, 2021 (which designates in the U.S.), which claims priority from U.S. Provisional Patent Application No. 63/093,283 filed Oct. 18, 2020, and the entire contents of which are hereby incorporated herein by reference in their entirety.

FIELD

The present disclosure relates to apparatuses and methods for building medical phantoms that can be configurable to include anisotropic diffusion networks and modules, as well as isotropic modules, and perfusion modules, for representing organized tissue that can be used in calibration and testing of MRI devices, medical devices, and for tissue models.

BACKGROUND

In the field of medicine, diagnostic medical imaging and medical devices have significant utility. Diagnostic medical imaging procedures such as Magnetic Resonance Imaging (MR or MRI) devices are used to diagnose certain disease states and conditions and locate pathologies. MR imaging can be used to locate certain tissues and structures, such as peripheral nerves, so that they are avoided during surgery, and when used to image the brain it can provide information relevant to surgical interventions such as location, size and orientation of a pathology such as a tumour or an aneurysm, and details on the nature of the pathology. MR imaging also helps identify eloquent regions of the brain that should be avoided when attempting to resect a lesion. Modalities of MR imaging can also leverage the different properties of water and fluids as they move in different ways through tissues in the body.

A modality of MR imaging called diffusion weighted imaging (DWI), can be used to measure the extent and direction of water diffusion through biological tissue. When water diffuses through tissue that has a high degree of organisation, the directions available for diffusion of water molecules are unequal and distinguishable. For example, white matter of the brain is highly organised along white matter tracts, with myelinated axons physically restricting movement of water in the radial directions (perpendicular to the direction of the tract) and allowing diffusion in the axial direction (along the direction of the tract) in the spaces bound between the axons that make up the tract.

A category of diffusion weighted imaging called diffusion tensor imaging (DTI) takes advantage of differences in the diffusion properties of water in different tissue types, where changes in the tissue type, organisation (e.g. location of a structure), architecture (e.g. co-location of structures), changes in directionality and the presence of barriers provide insights into the connectivity and organisation of tissue in organs such as the brain, and certain health metrics for the kidney, for example. While traditional imaging methods help distinguish between tissue that has different density or response for certain wavelengths of electromagnetic radiation (EMR), DTI helps distinguish between tissue that has organized structure from those that are disorganized, or homogenous in nature. Further, tissue with different orientation of organized structure, or structures, can be also distinguished.

Measuring the diffusion of water and changes in properties, such as the mean diffusivity (MD), or the directional preference of water (e.g., fractional anisotropy or FA) can be used to infer details about the brain's white matter fine structure, the perimeter of a structure (e.g., a pathology or a tumour), the substructure, area of damage, or a pathology within an organ such as the brain or kidney. For example, with respect to substructure, measuring the diffusion of water can help with observing the presence of a bifurcated pathway in the connection between two regions of the brain and determining the relative size of the bifurcated paths based on the relative difference in diffusion properties between the two arms of the bifurcated pathway.

DTI is a powerful imaging modality in that it does not require the delivery of ionizing radiation, chemical tracers or contrast agents and is thus ideally suited to in-vivo clinical applications where knowledge of white matter structures, their integrity, and presence of abnormalities are pertinent, such as in planning a neurosurgical intervention, where information regarding the location of a specific tract can be used to identify this structure, or a volume containing the structure, and a clinician may choose to avoid interacting with, traversing or removing this tissue.

For example, a clinician may avoid interacting with the tissue where the corticospinal tract has been identified, with the goal of preventing post-surgery paralysis and preserving quality of life of a patient.

DTI may also be used to identify breaks to tissue organization through injury, traumatic or otherwise, such as but not limited to traumatic brain injury (TBI), hemorrhaging or stroke, and may be used to monitor a neurodegenerative condition in a patient.

Diffusion-weighted MR imaging applications are limited by a number of factors, especially when used in-vivo, including the lack of a methodology to verify data quality, or to verify the properties of tissue being imaged by other means, such as the directionality of the tissue, the dimension of the structures making up the tissue and/or the health of the tissue. Accordingly, the application of DWI may be done with the use of a calibration source that can help identify specific directions of water molecule migration relative to the organization of the magnetic components in the MRI system. For example, the person reviewing the acquired image needs to know, a priori, how migration of water molecules will look when said molecules move in the head-to-foot direction versus the left to right direction of the scanner movement or top to bottom direction of the scanner movement. This, in turn, helps establish the orientation of the 3D coordinates for the DWI data. Such coordinates are often represented using colour-schemes that represent the three orthogonal axes. In addition, a phantom can potentially act as a 'ground truth' thereby providing an objective, independent, time-invariant measure of the data quality and veracity.

Generally, the changes in measurements through DWI imaging can be classed as qualitative, where the degree of diffusion can increase or decrease, relevant to adjacent locations measured in the same scan, and the resultant qualitative interpretations may be, for example, better/worse, damaged/less damaged/undamaged, or healthy/necrotic. DWI imaging has a low signal-to noise ratio and is susceptible to imaging artifacts. A means of quality assurance and quality control of DWI datasets has remained a barrier to its wider applicability and use.

Knowledge of potential pitfalls is implicit in interpreting imaging data. This, when coupled with the lack of a dataset quality assurance system, leads to uncertainty and underutilization of this modality and hinders the possible use of this data for surgical planning and diagnosis.

Another type of flow through tissue, which is known as perfusion, describes the delivery of nutrients and oxygen through tissues. For neuro applications, an example of a perfusion MR imaging method is Dynamic Susceptibility Contrast MRI (DSC-MRI), which employs a contrast agent which is injected and the measurement of signal loss through T2 imaging is recorded.

Perfusion imaging can be used to estimate hemodynamic properties, such as blood flow, blood volume, and have applications in the assessment and management of tumours, strokes and aneurysms.

SUMMARY OF VARIOUS EMBODIMENTS

In accordance with a broad aspect of the teachings herein, there is provided at least one embodiment of a phantom for use in MR imaging, wherein the phantom comprises an outer housing; at least one support plate disposed within the outer housing and having a plurality of locations for selectively receiving at least one element allowing for configurable phantoms to be created; the at least one element having anisotropic diffusion, isotropic diffusion, and/or perfusion characteristics, the at least one element being releasably connected at one of the plurality of locations on the support plate; and a matrix material contained within the outer housing, the matrix material being an aqueous fluid, wherein during MR imaging, the presence of the aqueous fluid, and directionality of fluid molecular diffusion within or through the at least one element are recorded in MR images.

In at least one embodiment, the at least one element comprises an isotropic diffusion module.

In at least one embodiment, the isotropic diffusion module has a main body with first and second end portions, the first end portion having a sealing cap, the second end portion having a connector and the body containing a fluid, wherein the connector is adapted to releasably engage a first surface of the at least one support plate.

In at least one embodiment, the isotropic diffusion module comprises an undercut at the second end portion to form a bubble entrapment chamber.

In at least one embodiment, the at least one element comprises a perfusion module that is couplable to an external fluid source and an external fluid drain that are both located outside of the phantom and during use fluid is able to flow from the external fluid source through the perfusion module to the external fluid drain.

In at least one embodiment, the at least one element comprises a plurality of perfusion modules that are coupled in series to allow fluid to pass from the external fluid source through the series of perfusion modules to the external reservoir during use.

In at least one embodiment, the perfusion module has a main body with first and second end portions and a plurality of rods with axes arranged along a longitudinal axis of the main body, wherein the first end portion includes: a first cap, a first permeable plate with a first surface that is spaced apart from an inner surface of an end of the first cap to define a first reservoir therebetween and a second surface that faces the plurality of rods, and a first tube connected to the first reservoir; and wherein the second end portion includes: a second cap with a connector on an outer surface thereof that is adapted to releasably engage the first surface of at least one support plate; a second permeable plate with a first surface that is spaced apart from an inner surface of an end of the second cap to define a second reservoir therebetween and a second surface that faces the plurality of rods, and a second tube connected to the second reservoir, wherein the first and second tubes are coupled to an exterior of the phantom to receive a fluid that flows through the perfusion module during MR imaging.

In at least one embodiment, a diameter of each rod of the plurality of rods is selected to define an amount of fluid flow through the perfusion module.

In at least one embodiment, the at least one element is at least one anisotropic diffusion module having a scaffolding and at least one fiber network, where the plurality of apertures provide positions for any termini, edges, and nodes of the at least one fiber network.

In at least one embodiment, wherein the at least one anisotropic diffusion module has at least one support post, and the at least one element comprises and optionally at least one crossbar connector, where the at least one support post is releasably connected to the first surface of the at least one support plate and assembled to support the fiber network.

In at least one embodiment, the at least one support post comprises a body having first and second end portions, the first end portion having a first connector for releasable attachment to a first support post and the second end portion having a second connector to releasably attach to the support plate or a second support post.

In at least one embodiment, the at least one crossbar connector comprises at least two end caps and a bar that connects to the at least two end caps where each end cap has a recess for receiving a free end portion of a single support post.

In at least one embodiment, the at least one fiber network comprises a fiber having at least one edge that is coupled to two support posts, the fiber edge having a thickness selected to provide anisotropic diffusion within a desired volume element during MR imaging.

In at least one embodiment, the at least one fiber network comprises two fiber edges that are coupled at a node.

In at least one embodiment, the fiber edges have different thicknesses.

In at least one embodiment, the at least one fiber network comprises a fiber, at least two termini, at least one additional node, at least one edge and optionally at least one bifurcation that are arranged according to a network structure that is selected based on a physiological nervous structure.

In at least one embodiment, the phantom comprises: (a) at least one isotropic diffusion module, (b) at least one anisotropic diffusion module, (c) at least one perfusion diffusion module or (d) any two of (a), (b) and (c) that are releasably connected to the first surface of the at least one support plate.

In at least one embodiment, the at least one support plate is an axial support plate that has an orientation that is parallel to a base of the phantom.

In at least one embodiment, the at least one support plate is a vertical support plate that has an orientation that is perpendicular to the base of the phantom.

In at least one embodiment, the vertical support plate has a first fiber network attached to a first surface thereof and/or a second fiber network attached to a second surface thereof.

In at least one embodiment, the first surface of the at least one support plate comprises a plurality of apertures adapted for receiving the at least one element.

In at least one embodiment, the at least one support plate comprises a second surface that is opposite to the first surface, the second surface including a machine-readable code pattern.

In at least one embodiment, the machine-readable code pattern is a unique binary code configured to provide a traveller code feature during manufacture and is transformable to a product identifier containing product, batch information after the phantom is constructed.

In at least one embodiment, the phantom comprises a lower plate for the outer housing and a plurality of spacers that engage a first set of recesses on an upper surface of the lower plate and a second set of recesses on the second surface of a given support plate that is closest to the lower plate for securing the given support plate to the outer housing of the phantom.

In at least one embodiment, the phantom comprises a plurality of support plates, where each support plate is connected to scaffolding and an associated fiber network.

In at least one embodiment, at least two of the associated fiber networks have different network patterns or same network patterns each having different fiber materials and/or fiber arrangements for simulating different degrees of health states.

In at least one embodiment, the outer housing comprises at least one port that is adapted to receive a medical device or a component of a medical device wherein during use the medical device or the component of the medical device is placed adjacent to a diffusion structure located on the at least one support plate in order to develop medical devices with desired imaging properties.

In at least one embodiment, the medical device component includes a Deep Brain Stimulation (DBS) lead.

In accordance with another broad aspect of the teachings herein, there is provided at least one embodiment of a method for creating an anisotropic diffusion network module for a phantom, wherein the method comprises: (a) defining a network pattern and locating network elements including termini, at least one fiber edge, optionally at least one bifurcation, and optionally at least one intersection in the network pattern; (b) defining relative positions of the network elements and connectivity between the network elements; (c) defining any intersections between the network elements as being one of a touch point, a partially interweaving intersection and a complete interweaving intersection; (d) defining the positions of the network elements using scaffolding positioned on a support plate and optionally including at least one isotropic diffusion module; (e) defining an origin position from which to begin assembly of a network pattern using a fiber material for making a model of the network; and (f) building a fiber network by attaching a desired fiber material to the origin position on the scaffolding and weaving the fiber material around scaffolding elements according to weaving instructions and the network pattern to form the anisotropic diffusion network module.

In at least one embodiment, the method comprises optionally defining a relative weighting between at least two fiber edges connected through a bifurcation or intersection.

In at least one embodiment, the fiber network comprises an intersection greater than 0 degrees and less than 180 degrees.

In at least one embodiment, the method comprises attaching the scaffolding and the fiber network along with a support plate to an interior surface of the phantom.

In at least one embodiment, wherein the anisotropic diffusion network module is constructed to simulate diffusion properties of a natural physiological structure.

In at least one embodiment, the fiber material is woven around the scaffolding elements to form a diffusion network with diffusion properties that mimic the natural physiological structure during MR imaging.

In at least one embodiment, the natural physiological structure being modelled is a cortico-spinal tract or a corpus callosum.

In at least one embodiment, the method comprises using a bicomponent fiber for the fiber material, where the bicomponent fiber comprises 'islands in the sea' fiber which includes polymeric rods covered in a soluble material.

In at least one embodiment, the method comprises building the fiber network comprises producing a first arrangement where fibers are spaced apart from one another in a z-direction.

In at least one embodiment, the method comprises submerging the fiber network in water to dissolve a fiber component and optionally heating the water to about 30-40 degrees Celsius.

In at least one embodiment, wherein after dissolving the fiber component the method comprises collapsing the fibers into a second arrangement.

In at least one embodiment, wherein after collapsing the fibers, the method comprises applying sheathing to the fiber network, applying tensioning to the fiber network and/or moving termini of the fiber network to produce a final arrangement for the fiber network.

In accordance with another broad aspect of the teachings herein, there is provided at least one embodiment of a method for building a parametric-model for representing DTI information of a nervous structure, wherein the method comprises: modelling a connected set of nervous structures using a mapping process based on steps (a) to (c) of the method of creating an anisotropic diffusion network module in order to create the parametric model by defining termini, edges with lengths, intersections, relative positions of intersections, intersection types, and a density of each network connection to represent the nervous structure; and storing the parameter model.

In at least one embodiment, the method further comprises using the parametric model to reduce a file size needed to store DWI or DTI information.

In at least one embodiment, the method further comprises using a series of parametric models, with different degrees of complexity at different distances from an area of interest, to reduce a file size needed to store DWI or DTI information.

Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

FIG. 4 shows a perspective view of a vertical support post.

FIG. 5 shows a perspective view of a spacer.

FIGS. 6A and 6B show perspective and cross-sectional perspective views, respectively, of an isotropic diffusion module.

FIGS. 11C-11I show example embodiments of various types of intersection modules that can be used to build a custom phantom in accordance with the teachings herein.

Figure 1A:
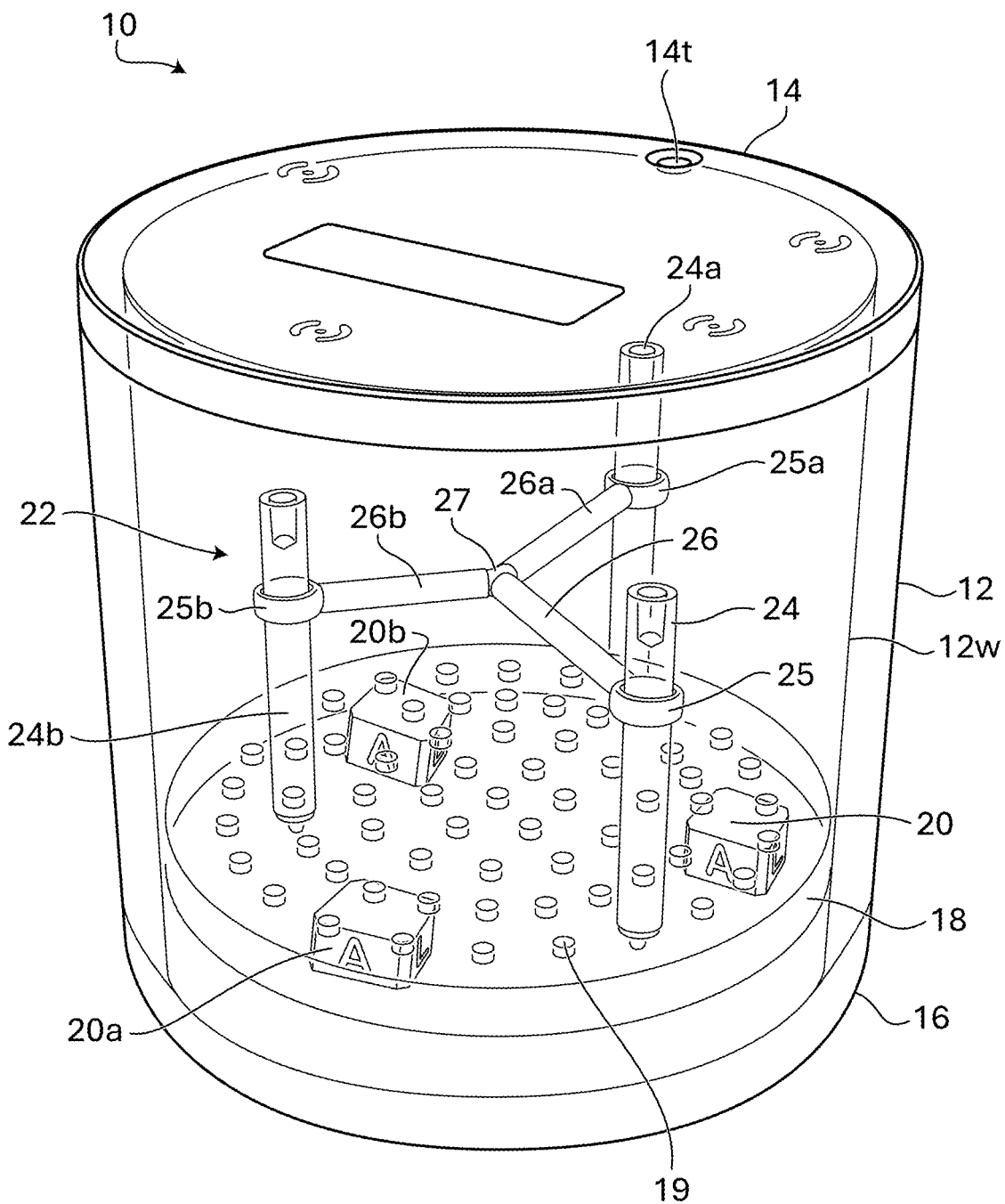
FIGS. 1A, 1B and 1C show example embodiments of phantoms.

Further aspects and features of the example embodiments described herein will appear from the following description taken together with the accompanying drawings.

DETAILED DESCRIPTION OF THE EMBODIMENTS

Various embodiments in accordance with the teachings herein will be described below to provide an example of at least one embodiment of the claimed subject matter. No embodiment described herein limits any claimed subject matter. The claimed subject matter is not limited to devices, systems or methods having all of the features of any one of the devices, systems or methods described below or to features common to multiple or all of the devices, systems or methods described herein. It is possible that there may be a device, system or method described herein that is not an embodiment of any claimed subject matter. Any subject matter that is described herein that is not claimed in this document may be the subject matter of another protective instrument, for example, a continuing patent application, and the applicants, inventors or owners do not intend to abandon, disclaim or dedicate to the public any such subject matter by its disclosure in this document.

For the purpose of simplicity and clarity of the illustrations, where considered appropriate, reference numerals may be repeated among the figures to indicate corresponding or analogous elements or steps. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Furthermore, it should be noted that reference to the figures is only made to provide an example of how various example physical elements and methods operate in accordance with the teachings herein and in no way should be considered as limiting the scope of the claimed subject matter. Also, the written description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical connotation. For example, as used herein, the terms coupled or coupling can indicate that two elements or devices can be directly connected to one another or connected to one another through one or more intermediate mechanical or physical elements.

Unless the context requires otherwise, throughout the specification and claims which follow, the word "comprise" and variations thereof, such as, "comprises" and "comprising" are to be construed in an open, inclusive sense, that is, as "including, but not limited to".

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should also be noted that, as used herein, the phrase "at least one of X, Y and Z" is intended to cover all combinations of X, Y and Z including X, Y, Z, X and Y, X and Z, Y and Y, as well as X, Y and Z.

It should be noted that terms of degree such as "substantially", "about" and "approximately" as used herein mean a reasonable amount of deviation of the modified term such that the end result is not significantly changed. These terms of degree may also be construed as including a deviation of the modified term, such as by 1%, 2%, 5% or 10%, for example, if this deviation does not negate the meaning of the term it modifies.

Furthermore, the recitation of numerical ranges by endpoints herein includes all numbers and fractions subsumed within that range (e.g., the range 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed, such as 1%, 2%, 5%, or 10%, for example.

Reference throughout this specification to "one embodiment", "an embodiment", "at least one embodiment" or "some embodiments" means that one or more particular features, structures, or characteristics may be combined in any suitable manner in one or more embodiments, unless otherwise specified to be not combinable or to be alternative options.

As used in this specification and the appended claims, the singular forms "a", "an", and "the" include plural referents unless the content clearly dictates otherwise. It should also be noted that the term "or" is generally employed in its broadest sense, that is, as meaning "and/or" unless the content clearly dictates otherwise.

This present disclosure describes a methodology and associated modular apparatus with various components that can be used to produce cerebrospinal anisotropic diffusion and perfusion phantoms. With a plurality of designs and embodiments that are possible, these phantoms may provide baseline or 'ground-truth' data that expands the applications that are possible with diffusion weighted imaging and perfusion imaging protocols. The teachings herein may also be used to produce custom phantom embodiments for specific tasks and applications.

In one aspect of the teachings herein, when creating phantoms using anisotropic diffusion modules, a relevant tract or natural substructure can be defined in terms of a network diagram, with edges (tracts), termini (tract ends) and node (intersection/junction) positions. Node positions can be confluences of tracts or bifurcations of nerves along different paths. In the case of bifurcations (i.e., separation of tracts), the percentage of the fiber in each path can be proportionally determined, for example, by a comparison of the diameter or cross-sectional area of the fiber tracts, by the number of fibers in each path, or by a ratio of voxels filled by the structures, or other means. The components described herein allow for the creation of phantoms with structures that can model these bifurcations.

Figure 1B:
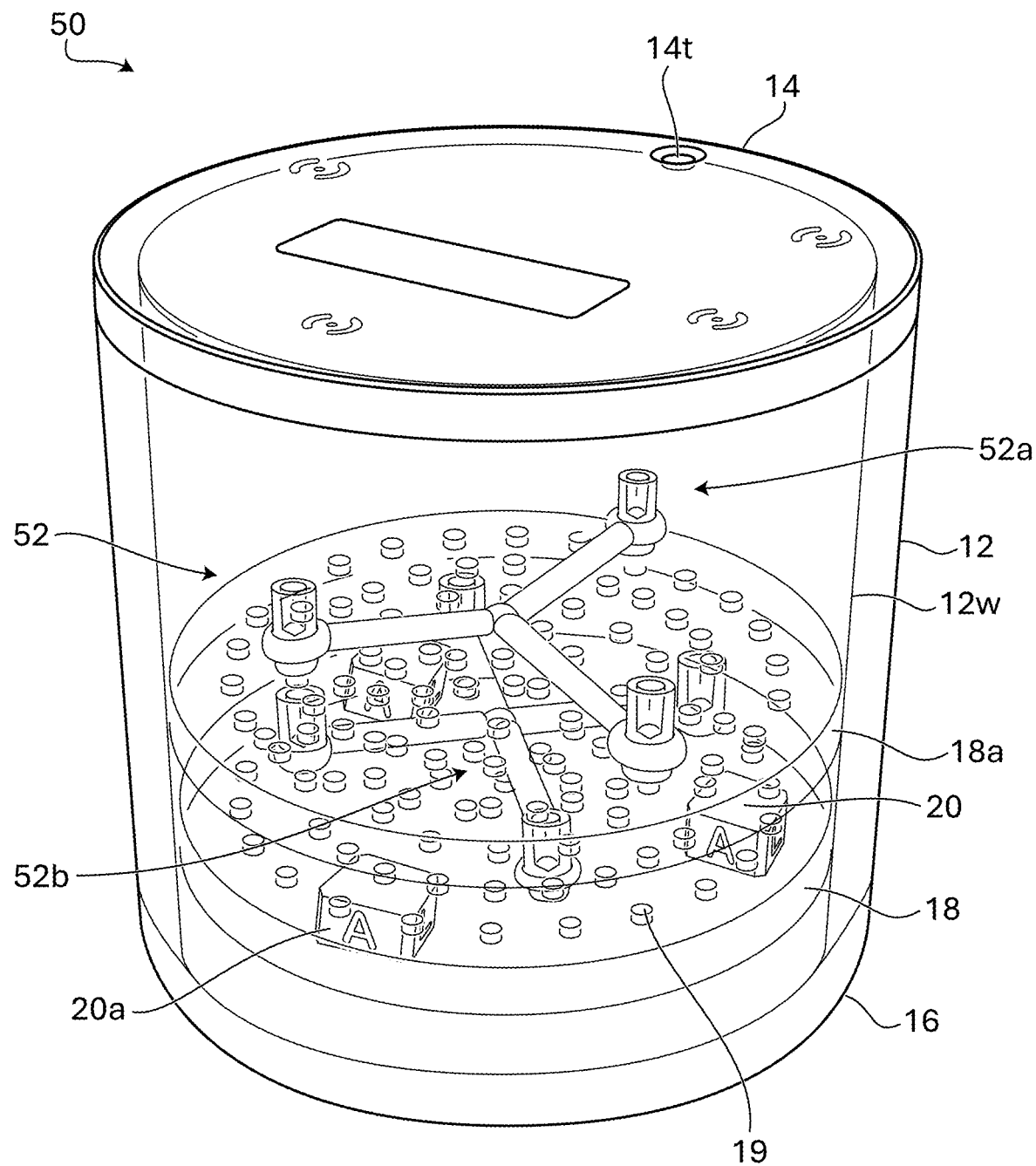
Figure 1C:
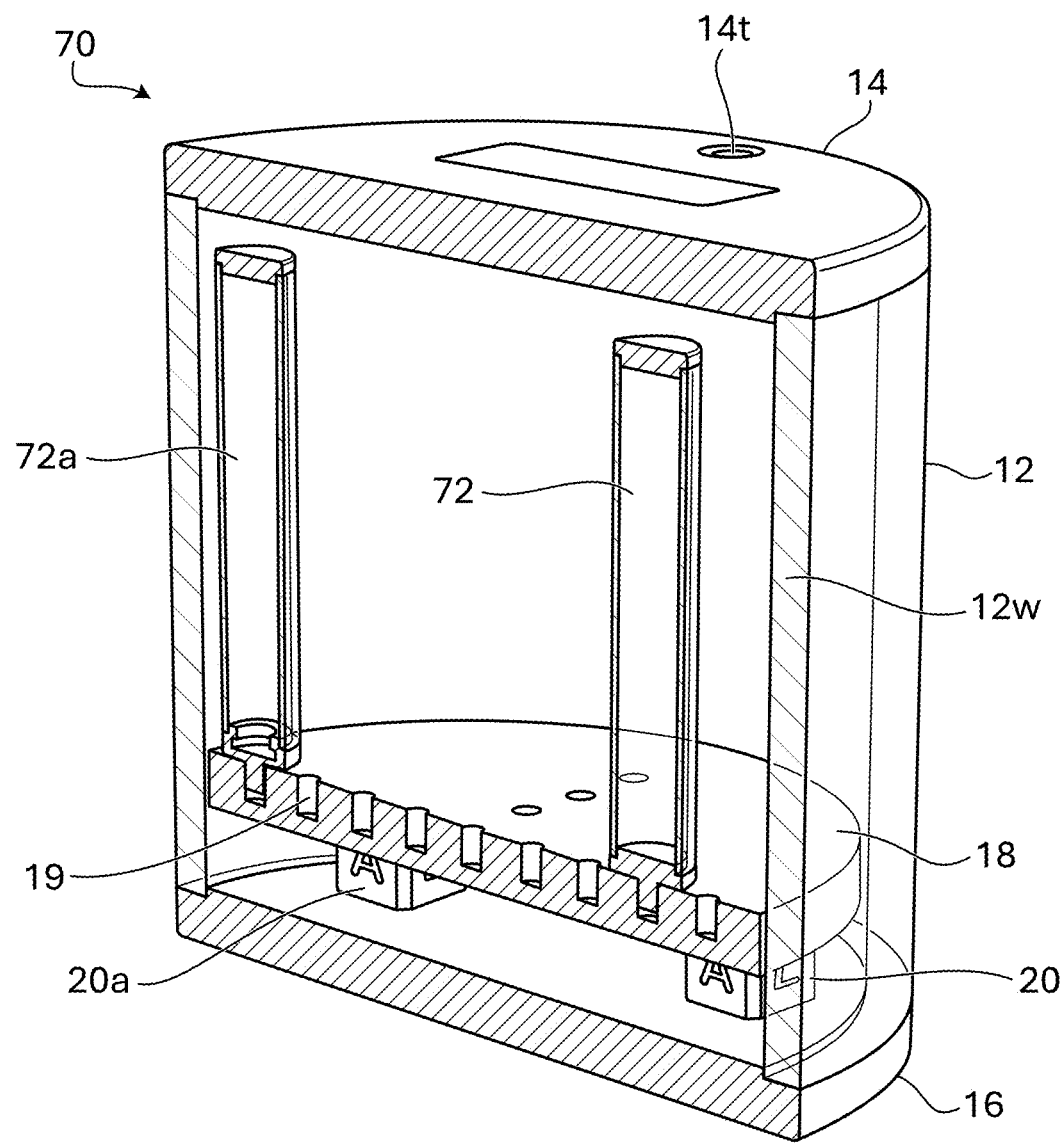

Referring now to FIGS. 1A-1C, shown therein are perspective views of example embodiments of some different phantoms 10, 50 and 70 that can be constructed according to the teachings herein. The phantoms 10, 50 and 70 include some common elements while other elements can be included and arranged in different manners so that the phantoms have different properties and can be used to model different nervous structures. The teachings herein can be used to produce a wide variety of configurable phantoms that are not limited by the examples shown and/or discussed herein. The components of the phantoms that are constructed in accordance with the teachings herein may generally be made of materials that are MR compatible. Examples include generally using acrylic for housing elements, vertical supports and other rigid components (e.g., machined elements), and polypropylene for fibers.

The phantoms 10, 50 and 70 include an outer housing that is dimensioned to be compatible with scanning processes for human subjects, including compatibility with head coils and arrangement in multiple configurations. Accordingly, some example embodiments for the phantoms are sized to approximate the human head and may have a diameter of about 7" and a length of between about 170-190 mm. The outer housing generally includes a cylinder 12 having a side wall 12w, a top plate 14 and a base plate 16. The side wall 12w may be cylindrical or may have a more complex shape to approximate the shape of a biological structure such as a head or torso, for example. The outer housing contains certain components that can be referred to as inner housing elements. The outer housing and/or certain internal structures of the housing may contain fiducial positions on the interior and exterior surfaces thereof.

In some embodiments, the outer housing may contain attachment positions for external connectors (e.g., tubing for access to perfusion modules to provide a flow of fluid therethrough). In at least one embodiment, certain internal structures may contain positional indicators such as interior fiducial marker positions, which may help orient the internal structures), and/or suggested interior placement positions for medical devices or components thereof. In at least one embodiment, the outer housing may also contain means (e.g., one or more ports) for inserting and placing medical devices, or components of medical devices, in proximity to one or more diffusion modules that are attached to the support plate 18 and located within the outer housing, in order to determine the effects of co-placement of the medical devices on data acquisition processes. For example, an openable port (e.g., with a screw fitting) may be used to allow placement of a Deep Brain Stimulation (DBS) probe in proximity to an anisotropic diffusion network in order to ascertain how the imaging properties change, e.g., in order to predict how imaging a patient may change post placement of a medical device. This may be used to develop medical devices with desired imaging properties or imaging compatibilities. The outer housing is also filled with a fluid, referred to as a "matrix," which can be water or an aqueous solution that may contain a germicide agent, or a salt (e.g., manganese salt or nickel salt) that may change the signal intensity (magnetic susceptibility) of the matrix. The top plate 14 can include a tap 14t and screw (not shown), which is located close to the edge of the plate, which can be used to fill of the outer housing with fluid.

The phantoms 10, 50 and 70 also generally include an axial support plate 18, spacers 20, 20a and 20b, and various components that provide a scaffolding (also referred to as a scaffold structure) for a fiber network. The spacers 20, 20a and 20b rest on top of the base plate 16 and the axial support plate 18 rests on top of the spacers 20, 20a and 20b. The axial support plate 18 includes a plurality of apertures 19 that are used to releasably secure certain elements of the scaffolding. The diameter of the axial support plate 18 is sized to be smaller than the inner diameter of the outer housing wall 12w so as to be slidably received within the wall 12w of the cylinder 12 such that there is a slight gap therebetween. The axial support plate 18 is coupled to the bottom plate 16 of the outer housing via the spacers 20, 20a, 20b (e.g., received in recesses 21 and 17 of the support plate 18 and the bottom plate 16, respectively) so that the internal components do not move with respect to the outer housing of the phantom.

With respect to FIG. 1A, the phantom 10 includes a scaffold structure 22 that is made using support posts 24, 24a and 24b, as well as elements of a fiber network (e.g., fiber elements 26, 26a and 26b) that provide an anisotropic diffusion model. The fiber elements 26, 26a and 26b may be wrapped in sheaths in a certain manner around some of the support posts and are secured in place at certain heights on the support posts 24, 24a and 24b by using loops 25, 25a and 25b of the fiber. The sheaths help to maintain the fiber elements in place and maximize surface area per volume element, (voxel) for image scanning. The fiber elements 26, 26a and 26b, which may also be referred to as fiber edges, intersect at a central node 27 which may be secured using a cable tie (other fastening elements rather than cable ties can also be used).

Figure 2A:
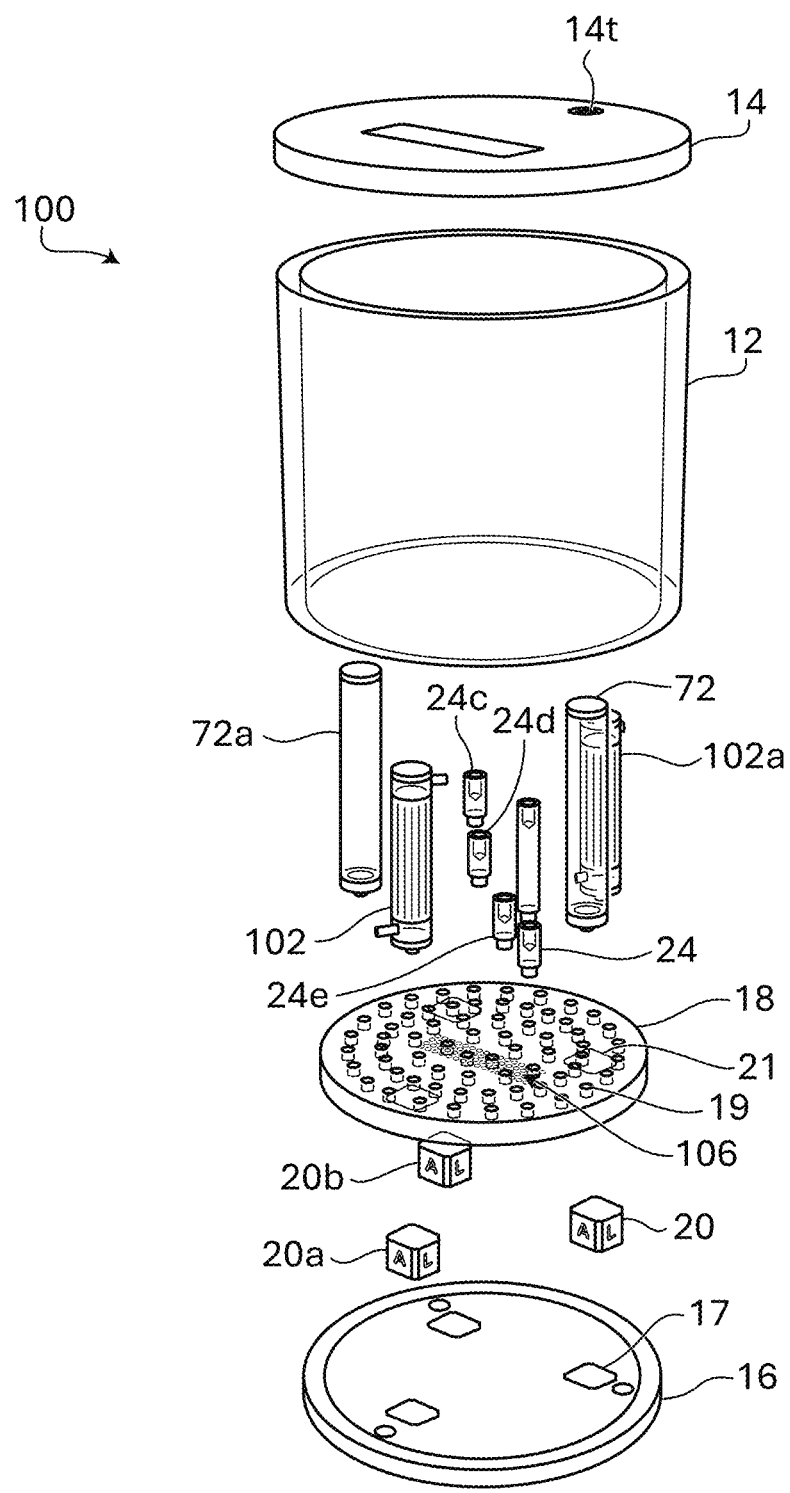
FIGS. 2A and 2B show exploded views of example embodiments of phantoms.
Figure 2B:
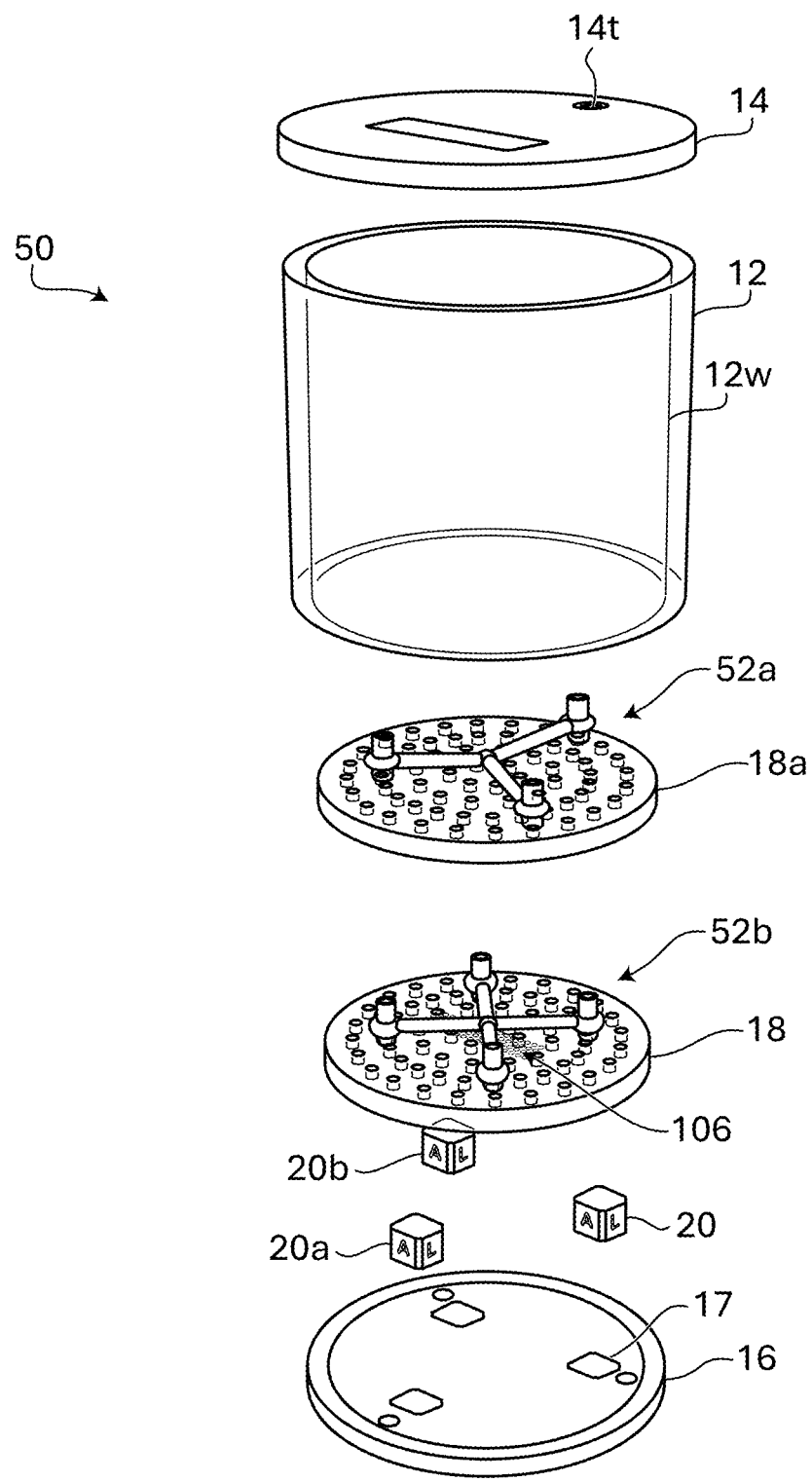

With respect to FIGS. 1B and 2B, the phantom 50 includes a different scaffold structure 52 which contains a first anisotropic assembly 52a and a second anisotropic assembly 52b that are located at different levels (i.e., different horizontal plains (e.g., planes or flat surfaces) or different heights) and each have scaffolding with associated fiber networks. In at least one embodiment, each fiber network may have different network patterns for simulating different degrees of health states including a healthy state and/or a disease state. Alternatively, in at least one embodiment, two fiber networks may be made with the same weaving pattern, but differing in the fiber materials that are used, where the fiber material for each network may have different dimensions (e.g., different diameters, and/or cross-sectional area shapes) for simulating different degrees of health states. These network patterns may be determined according to the teachings herein.

Only certain elements are numbered in FIGS. 1B and 2B for ease of illustration. Accordingly, the phantom 50 includes the axial support plate 18 and a second axial support plate 18a. The first anisotropic assembly 52a is releasably attached to the first axial support plate 18a and has a similar structure geometry as the scaffold of phantom 10 although shorter support posts are used in the first anisotropic assembly 52a so that the fibers are closer to the axial support plate 18a. The second anisotropic assembly 52b also includes shorter support posts, relative to phantom 10, but there are more support posts and fiber elements that are arranged to have an X-shaped geometry. The axial support plates 18 and 18a are joined by connectors via the apertures in the axial support plates.

The two different anisotropic assemblies 52a and 52b may also be referred to as being two different anisotropic diffusion modules. Accordingly, an anisotropic diffusion phantom can be made up of a plurality of anisotropic diffusion modules on one axial support plate or on a plurality of axial support plates within the same outer housing.

With respect to FIG. 1C, the phantom 70 represents an isotropic diffusion phantom that includes a layout with two isotropic diffusion modules 72 and 72a which are releasably secured to two apertures in the support plate 18.

With respect to FIG. 2A, shown therein is an exploded view of a phantom 100, which includes components for building another different scaffold. In this case the components include support posts 24, 24c, 24d and 24e, isotropic diffusion modules 72 and 72a as well as perfusion modules 102 and 102a. As shown, the support posts can generally be of different heights. For example, support post 24 can be about 80 mm in height while support posts 24c, 24d and 24e can be about 20 mm in height. In other cases, the support posts can also have different circumferences to change the tension in the fiber network. The components shown in FIG. 2A can be used to construct a more complex phantom. A phantom with support posts having different heights may be used when there is more than one fiber network that is to be mounted on the same axial support plate where the fiber networks are at different heights, or a fiber network is placed in an orientation that it is not parallel to the plain of the axial support plate.

A number of the components that can be found within the outer housing of the configurable phantoms, in accordance with the teachings herein, will now be described in further detail.

Figure 3A:
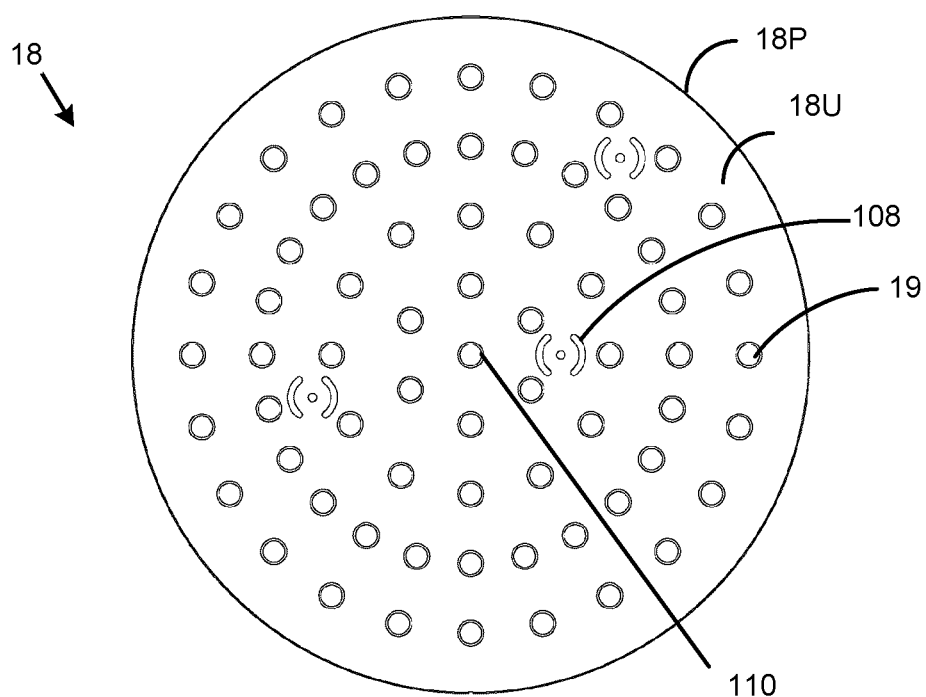
FIGS. 3A and 3B show top and bottom views of an axial support plate.
Figure 3B:
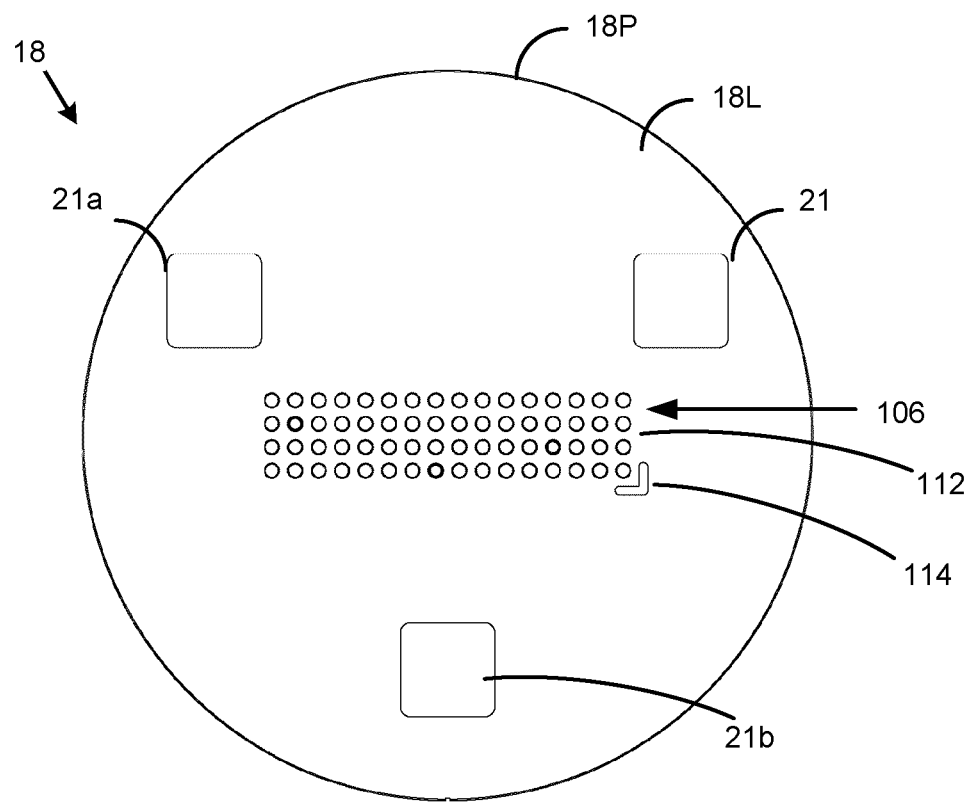

Referring now to FIGS. 3A and 3B, shown therein are top and bottom views of an axial support plate 18. The axial support plate 18 is used to hold various modules and components, which can also be referred to as elements, that make up the internal housing of a phantom. The axial support plate 18 may be referred to as having an axial orientation since it will typically appear in the plain of an axial slice of MR data when it is horizontally positioned and undergoes MR imaging. However, in at least one alternative embodiment, the axial support plate 18 may have a different orientation and instead may more generally be referred to as a "support plate". The support plate 18 is typically transparent, or at least semi-transparent, which allows elements within the phantom to be seen from various angles, which is useful when the phantom is placed in an MR unit, or when checking on the placement of a medical device element, e.g., DBS lead, within a phantom. However, there may be some cases in which the support plate 18 may not be transparent.

As explained previously, the support plate 18 can have a diameter less than the inner diameter of the side wall 12w that provides a perimeter 18P, which is selected so that the support plate 18 is receivable within the cylindrical housing 12. The thickness of the support plate 18 is generally selected so that it is large enough to provide enough physical space for apertures for receiving male connectors of certain inner housing components on one surface and apertures on an opposing surface for providing code positions for indicating a code. A code can be used to identify a structure to be built, track a phantom in the process of being built (e.g., tracking a work), or indicate other information as is described in further detail with respect to FIG. 3B. The thickness of the support plate 18 can also be chosen so that apertures on either surface of the support plate do not interfere with one another even if they at similar locations on either surface of the support plate 18.

The support plate 18 is mounted on the inside of the cylindrical outer housing 12 and contains, on an upper surface 18U, a plurality of apertures 19 that serve as female connectors for attachment positions and can be used to releasably receive various elements of the inner housing, such as one or more support posts that may be used to define the positions of termini, intersections of fiber networks, one or more anisotropic diffusion modules, one or more elements of anisotropic diffusion networks, one or more isotropic diffusion chambers and perfusion modules. One of the apertures, i.e., aperture 110, serves as a central reference point for the support plate 18 and corresponds with the center axis of the phantom, which in FIG. 3A, is perpendicular to the plain that the support plate 18 is located in. In the embodiments shown herein, the positions of apertures 19, other than aperture 110, may be located such that there are a plurality of locations that are equidistant from the central position.

In general, the apertures 19 include threads which are complimentary to threads on male connection posts of elements that rotatively engage the axial support plate 18. In alternative embodiments, the apertures 19 can be channels with smooth side walls such that they can slidably receive a male connection post (with a smooth outer wall) of an element that is being mounted on the support plate 18. In other embodiments, the support plate 18, can have some apertures 19 with smooth side walls and some apertures 19 with threaded sidewalls.

The upper surface 18U of the support plate 18 can also include internal fiducial markers 108 that allow the phantom to be registered with the imaging scan data. There can be several internal fiducial markers. For example, in some embodiments, there may be about five fiducial markers on the exterior of the upper plate 14 and two fiducial markers located somewhere within the outer housing. Fiducial markers may also be present on the cylindrical edge around the perimeter 18P of support plate 18.

The support plate 18 also has a lower surface 18L which includes recesses 21, 21a and 21b for receiving the spacers 20, 20a and 20b, respectively. The spacers 20, 20a, and 20b connect the lower surface of the support plate 18 to the inside surface of the lower plate 16 of the outer housing 12.

The lower plate 16 also includes recesses 17 for receiving the spacers 20, 20*a*, and 20*b*. The spacers may have a cubic or parallelepiped shape.

The lower surface 18L of the support plate 18 may also include a grid 106, which can be used to create a unique identifier, such as a binary code, for identifying the phantom. For example, the grid 106 includes a plurality of apertures 112, which can receive round pegs (e.g., code pin dowels) to create machine readable code patterns such as binary-code patterns. In at least one example embodiment, the grid 106 can contain enough apertures 112 to allow a 64-bit code to be debossed into the lower surface 18L of the support plate 18. An indicator 114 can specify the orientation of the code. The binary code pattern can provide various data and functions for each support plate, to which they are applied, such as, but not limited to, (a) identifying a specific configuration of modules for a phantom embodiment, (b) identifying a set of manufacturing steps to build a desired/required module, (c) acting as a traveller throughout the manufacturing process to identify a component or work in process, (d) indicating which modules are to be attached to the axial support plate 18, (e) converting a product type identification code into a final product code for shipping to a customer, and (f) supporting a quality control check to verify whether the correct phantom was assembled. In another example use, the ID code can identify an anisotropic diffusion module that is positioned on the support plate, or once a phantom assembly process is complete, the ID code can be used to provide a full phantom product description and unique identifier.

Further, if a code has already been used to identify a specific product, the code can be modified, or added to, in order to uniquely identify a clone of this product, e.g., by using a UIN unique identifying number. Furthermore, the traveller identification encoded in the grid 106 may transform in function to a product identification code containing product batch information, date of manufacture, location and site information as well as other information relevant to the phantom use, or for tracking, certification, and/or identity purposes. Additionally, the binary code used for traveller identification may be compatible with MR imaging so that it appears in the image dataset output from an imaging scan (e.g., an MR image slice) thereby allowing for further tracking and other applications of the datasets (e.g., confirming the same phantom was scanned in two locations, allowing other (e.g., patient) datasets to be directly compared using the phantom data as a known data point).

In another embodiment, the support plate may be in an orientation at 90° to that described above and contain upright positions on both of its surfaces. Primary processing steps may be used to create a structure for a fiber network that is, during secondary assembly process steps, arranged in such a way as to require connection to support posts on both surfaces of the support plate. For instance, in one example embodiment of a cerebral phantom, the position of the support plate will correspond to the plain of the mid-sagittal axis of the brain, and the diffusion network (i.e., the scaffolding and optionally a fiber network) that is attached to the support plate is representative of the corpus callosum tract which traverses this plain. In such cases, the support plate may be referred to as a sagittal support plate or a vertical support plate.

Alternatively, in at least one embodiment, a phantom may include a plurality of support plates that each contain a plurality of diffusion network patterns which may be assembled together and placed within an outer housing unit. In such cases, the support plates can be modified to have through holes to allow for the placement of fiber-network edges through the plain of the support plates.

In general, the support plates may be used to support various modules such as one or more anisotropic diffusion modules, a perfusion module, one or more isotropic diffusion modules, a plurality of perfusion modules or any combination of isotropic diffusion modules, perfusion modules and anisotropic diffusion networks.

Referring now to FIG. 4, shown therein is a perspective view of a vertical support post 24, which may also be referred to as an upright. The support post 24, which may be temporary, can be used during the primary processing steps when a fiber network structure is created on the scaffold, the scaffold being collectively the support plate containing the required set of support posts. Alternatively, one or more support posts may be permanent and remain in place as part of the final phantom product. In general, support posts are upright column pieces that can be used in a fiber network to define the positions of a network terminus, an intersection/node, or create a radius of curvature for a turning fiber. The support post 24 can be releasably attached to the axial support plate 18 by using a reversible mating feature as previously described. Accordingly, the support post 24 can be removed, and the fiber tensioned, by relocating the support post 24 to another position on the support plate 18 and/or rotating (e.g., 360 degrees) the support post 24 to incorporate a twist in the fiber.

The support post 24 generally includes a body 150, formed by a cylinder or tube, having a first end portion 152 and as second end portion 154. The first end portion 152 includes a channel forming a female connector 156 and an annular surface around the channel forming a first shoulder or end face 158. The second end portion 154 includes a threaded post, with a smaller diameter than the body 150, that provides a male connector 160 and an annular surface around the threaded post to form a second shoulder or annular ring 162. In some cases, where support post 24 is meant to be permanently attached to the support plate, glue or some other fixative material may be applied to the annular surface or the male connector 160. In an alternative embodiment, the threaded post may have roughly the same diameter as the body 150 so that there is no annular surface. In either case, the female connector 156 is adapted to receive the male connector of another support post (not shown). The male connector 160 is adapted to releasably connect to the female connector of another support post (not shown) or to releasably connect with an aperture 19 on the support plate 18. Support posts can have bodies of different lengths thereby providing different heights when the support posts are attached to the support plate 18. Support posts of different heights can be used in the same phantom. In some embodiments, support posts may have different body thicknesses to support various radii of curvature for a fiber network edge that is turned around the support post.

In defining an origin position for the beginning of a fiber network, the position in the plain of the support plate 18 (e.g., the XY plain) can be defined by the female position used in the support plate 18 and the Z coordinate that is defined in the direction of the support post 24. In alternative embodiments, two support posts can be connected to one another to form a taller support post and a fiber may be secured via an interference fit at a position that is located between where the male connector of the upper post engages the female connector of the lower post. This allows for the end of the fiber to be at a defined origin position. With the support posts positioned on the support plate 18, patterns of fiber or microfiber can be woven around and between the support posts in a predetermined pattern, starting with an origin position and traced in a predefined known pattern to create an anisotropic diffusion network module, also known as a diffusion network, which is analogous to a 3-dimensional network diagram, with various numbers (including zero) of termini, bifurcations, intersections, edges and/or touching or contact positions (e.g., "kissing positions"), between surfaces of adjacent edges of a network or a collection of networks.

Referring now to FIG. 5, shown therein is a perspective view of a spacer 20. The spacer 20, which may also be referred to as a standoff connector, is used to connect the support plate 18 to the inside surface of the outer housing 12. The lower surface 204 (not shown) of the spacer 20 is used to connect with the outer housing (i.e., the upper surface of the lower plate 16), and the upper surface 202 of the spacer 20 is used to connect with the lower surface 18L of the axial support plate 18. The remaining 4 surfaces of the spacer (two surfaces 206 and 207 are shown) may include orientation features that are debossed thereon, such as, for example, the letter "L" meaning a left orientation on surface 206, and the letter "A" (208) meaning an anterior orientation (as in anterior-posterior). In the case of symmetric features such as that indicated by the letter 'A', further orientation data can be added such as by adding a debossed circle 210 to the surface 207. If the debossed circle was on the wrong side of the A in the dataset, it may mean the dataset was reflected (mirror-image) e.g., the left-right orientation is switched, which if not otherwise known may lead to incorrect data interpretation.

Referring now to FIGS. 6A and 6B, shown therein are perspective and cross-sectional perspective views, respectively, of an isotropic diffusion module 72. Isotropic diffusion modules are sealed chambers, that are configured for attachment to the axial support plate 18 and contain a solution that has been modified to control viscosity properties of the isotropic diffusion module. For example, an aqueous solution of poly-vinyl pyrrolidone may be used.

The isotropic diffusion module 72 includes a body 252 with a side wall 252w defining a chamber 252c therein, a first end portion 254 and a second end portion 256. The body 252 and the side wall 252w may be cylindrical or another shape in at least one embodiment as long as one end is flat for connected to a support plate. The first end portion 254 of the isotropic diffusion module 72 includes a shoulder or ridge 258 and an end cap 260. The second end portion 256 of the isotropic diffusion module 72 includes a shoulder or ridge 262, an end cap 264 with a male connector 266 and rib 268 defining an undercut for forming a bubble entrapment chamber 270 between the rib 268 and the inner surface of the cap 264. The end caps 260 and 264 may also be referred to as sealing caps. The bubble entrapment chamber 270 may be used to trap any bubbles below/behind the rib 268 when the phantom is placed on its side during an MR scanning procedure and one or more bubbles are formed. Accordingly, any bubbles that may be formed are prevented from moving into the chamber 252c which may otherwise have an undesirable effect during imaging. The cap 264 also has a flat annular surface around the male connector 266. In this example embodiment, the male connector 266 is a threaded post. The male connector 266 is adapted to releasably engage an aperture 19 of the upper surface 18U of support plate 18. A fluid of desired viscosity is contained within the chamber 252c and isolated from the main matrix fluid at the opposite end by the sealing cap 260 where the main matrix fluid is within the outer housing of the phantom.

Figure 7A:
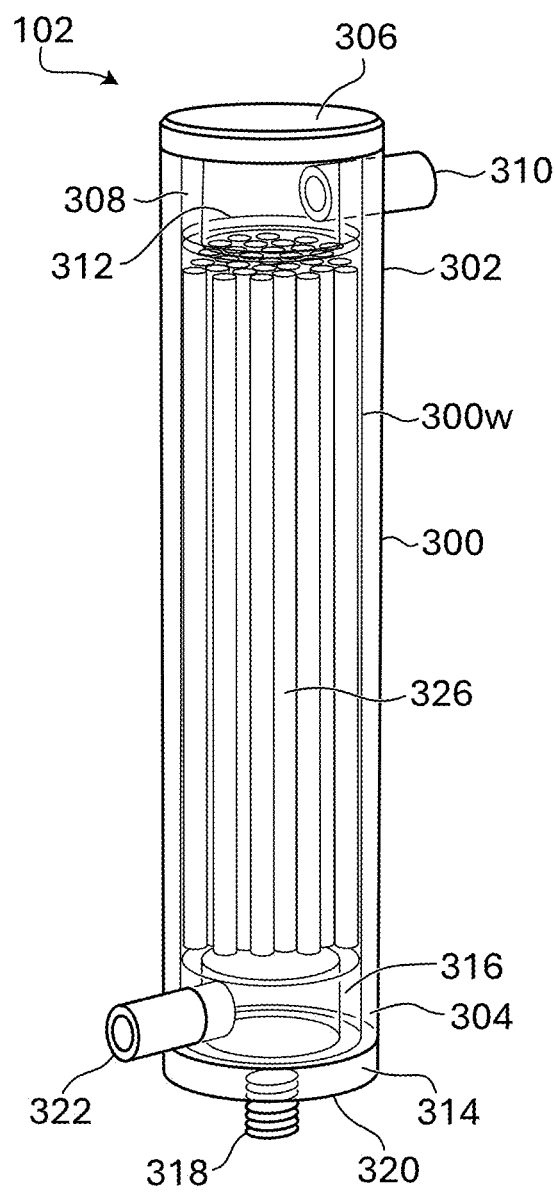
FIGS. 7A and 7B show perspective and cross-sectional perspective views, respectively, of a perfusion module.
Figure 7B:
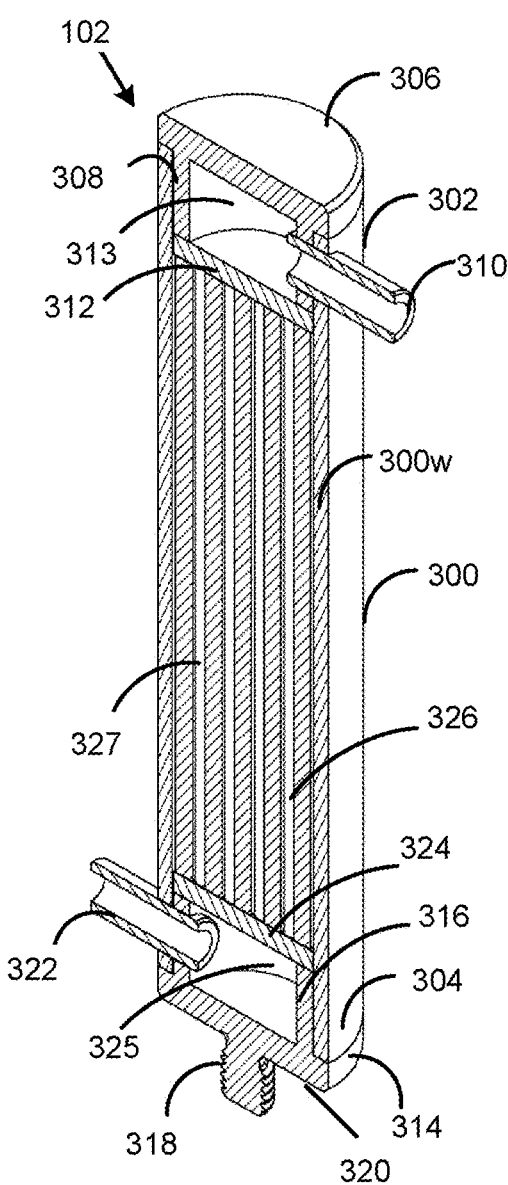

Referring now to FIGS. 7A and 7B, shown therein are perspective and cross-sectional perspective views of a perfusion module 102. Perfusion modules are chambers capable of simulating the perfusion of fluids (for example a contrast agent, blood or nutrients) through tissue. In this example, a plurality of polymeric rods are used within the perfusion module 102 to break up flow and emulate the perfusion of blood through tissue. An inlet of the perfusion module 102 may be connected to the exterior surface of the phantom via a first tube, and an exit of the perfusion module 102 may be connected to the exterior of the phantom via a second tube such that a manifold that includes the perfusion module 102 is created in the phantom and a fluid can be passed from an external fluid source that is outside of the phantom through the perfusion module 102 to an external fluid drain that is outside of the phantom via a pump, syringe pump or other means. In another embodiment, more than one perfusion module may be coupled in series so that fluid passes through a series of perfusion modules before exiting the phantom. Biological structures can also be represented using the perfusion module 102. Some examples of such biological structures include, but are not limited to, grey or white matter of the brain, or the interior of a blood vessel or a representation of the interior portion of a blood vessel containing an aneurysm, for example.

As shown in FIGS. 7A and 7B, the perfusion module 102 generally includes a body 300 having a side wall 300w, a first end portion 302 and a second end portion 304. The body 300 and the side wall 300w may be cylindrical or another shape in at least one embodiment as long as one end is flat for connected to a support plate. The first end portion 302 of the perfusion module 300 includes an end cap 306 with a side wall 308, a tube 310 and a first permeable layer 312 (also known as a permeable plate). The side wall 308 of the end cap 306 is slidably received by a first end portion of the side wall 300w and makes a friction fit thereat. Both the end portion of the side wall 302 and the side wall 308 have an aperture for receiving the tube 310. The tube 310 may act as an inlet port or an exit port for receiving or expelling fluid, respectively, depending on the direction of fluid flow. In at least one embodiment, the aperture for receiving the tube 310 may be located in the end cap 306. The space between the interior of the end cap 306 and the upper surface of the permeable layer 312 provides a chamber 313. When the fluid is moving in the direction from first end portion 302 to second end portion 304, the chamber 313 may create a body of fluid with about the same cross-sectional area of the interior of the body 300 such that the fluid moves through substantially all of the interior of the perfusion module 102. The permeable layer 312 may be a permeable frit (e.g., fritted glass) or other suitable structure that allows for fluid flow therethrough.

The second end portion 306 of the perfusion module 300 includes an end cap 314 with a side wall 316, a male connector 318, an end face in the shape of an annular ring 320 disposed about the male connector, a tube 322 and a second permeable layer 324. The side wall 316 of the end cap 314 is slidably received by a second end portion of the side wall 300w and makes a friction fit thereat. Both the second end portion of the side wall 304 and the side wall 316 have an aperture for receiving the tube 322. The tube 322 may act as an inlet port or an exit port for receiving or expelling fluid, respectively, depending on the direction of fluid flow. In at least one embodiment, the aperture for receiving the tube 322 may be located in the end cap 314, with the tube 322 passing through the interior of male connector 318. A region defined by the side wall 316 and the inner surface of the end cap 314 and the lower surface of a second permeable layer 324 (also known as a permeable plate) defines a chamber 325 (which may also be referred to as a reservoir). The chamber 325 may operate in the same fashion as the chamber 313 to allow for equivalent setups for both directions of fluid flow. The male connector 318 is used to releasably connect the perfusion module to the support plate 18.

The perfusion module 102 also includes a plurality of rods 326 that extend in the axial direction within the main body 300 of the perfusion module 102 and are disposed in a cylindrical or other arrangement. The rods 326 generally have a circular cross-section and are solid. In alternative embodiments, the rods 326 may have a non-circular cross-section, such as elliptical, irregular or another shape, as long as spaces are created between the rods 326. Additionally, or in other alternative embodiments, the rods 326 may be non-solid; for example, the rods may be pipes. In at least one embodiment the pipes may have an interior cross-sectional area about the same as the space 327 between the rods such that fluid may also flow through the interior. In general, the rods 326 or pipes may have a range of different diameters that can vary over one or more orders of magnitude such as, but not limited to, 2-micrometers or 100-150 micrometers. The cylindrical arrangement of the rods 326 allows for a plurality of conduits or channels to be formed between the rods 326 to allow for fluid flow between the tubes 310 and 322. The volume of the fluid within the perfusion module 102 may be modified by changing the diameters of the rods 326. A perfusion module 102 which has a smaller volume and lower flow of fluid therethrough may be used to model physiological structures with different perfusion characteristics.

The diameter of the rods 326 in the perfusion module 102 can be selected so that the space 327 between the rods 326 supports different rates of perfusion. As the diameter of the rods 326 increase, the spacing 327 between them will also increase resulting in an increase in the flow of fluid therethrough during imaging. Accordingly, the size (e.g., diameter) and/or number of the rods 326 can be selected to model different perfusion rates through the module. For example, for modeling/simulating cerebral perfusion pressure, the diameter of the rods 326 and the fluid flow may be selected to provide a perfusion rate commensurate with a pressure gradient in the range of about 55 to 85 mg Hg (Mercury).

The tubes 310 and 322, are connected to the outer housing of the phantom and facilitate the flow of fluid through the perfusion module 102. In one example embodiment, a length of tubing is connected to a syringe pump that is located at a safe distance from the MR hardware (e.g., in the control room). The syringe pump maintains a desired flow rate of fluid through a perfusion module manifold that is located at the side wall of the body of the phantom's outer housing or its bottom plate or upper plate. In one example, the fluid may be a contrast agent and the perfusion module 102 is used to validate the use of the contrast agent for the visualisation of a structure, during a given scanning protocol.

During use, the liquid/solution which is under study may enter the perfusion module 102 via an inlet port at tube 310, travel to the reservoir chamber 313 and pass through the permeable layer 312 into the portion of the cylindrical body 100 that contains the rods 326. In other words, the permeable layer 312 is used to deliver the material to be perfused to the entire perfusion module 102 within the chamber 313. The rods 326 can be selected to modify the rate of fluid passage through the cylindrical body 100. The fluid then passes through the second permeable layer 324 into the chamber 325 and exits the perfusion module 100 through tube 322 which provides an output port. The purpose of the permeable layer 314 is similar to the permeable layer 312 and allows for the fluid flow in the perfusion module 102 to be reversed. The fluid then exits the phantom via tubing, which may be similar to that used to introduce the fluid into the phantom.

In another aspect, in accordance with the teachings herein, there can be alternative embodiments for isotropic diffusion modules in order to customize the isotropic diffusion modules, by allowing for a change in the properties of the liquid contained within the isotropic diffusion modules, according to specific needs. For example, viscosity properties of the liquid may be adjusted by making solutions, such as, for example, but not limited to, by mixing water and different amounts of polyvinylpyrrolidone (PVP) (e.g., 10 wt. % PVP in water, 20-40 wt. %). Once a liquid is placed in an isotropic diffusion module and the isotropic diffusion module is sealed using a sealing cap, the diffusion properties of the isotropic diffusion module are fixed.

In both the isotropic and perfusion diffusion modules, the male connectors allow for the chambers of these modules to be positioned at designated positions with respect to the support plate 18. In addition, in some phantoms, the outer surface of the bodies of the isotropic diffusion module and/or perfusion diffusion module may be used to create a radius of curvature for an element of the anisotropic diffusion module, such as, but not limited to, an edge of a module of a fiber diffusion network. For example, a phantom can have one or more elements with a pre-selected radii of curvature to provide an anisotropic diffusion network that changes direction or follows a curved path within the phantom for modeling certain physiological structures.

In accordance with the teachings herein, in another example phantom embodiment, the phantom can have an isotropic diffusion module configuration that includes two or more isotropic diffusion modules with varying isotropic properties placed at equivalent distances from the center axis of the phantom, in order to obtain measurements of the different isotropic properties. These various isotropic properties may be specified by a customer or various health or scientific organizations such as the National Institute of Science and Technology (NIST), for example.

In accordance with the teachings herein, in another example phantom embodiment, the phantom can have an isotropic diffusion module configuration that includes two or more isotropic diffusion modules with equivalent isotropic diffusion characteristics placed at different positions in the phantom to identify differences in diffusion characteristics as a result of these variables (i.e., different positions).

Figure 8A:
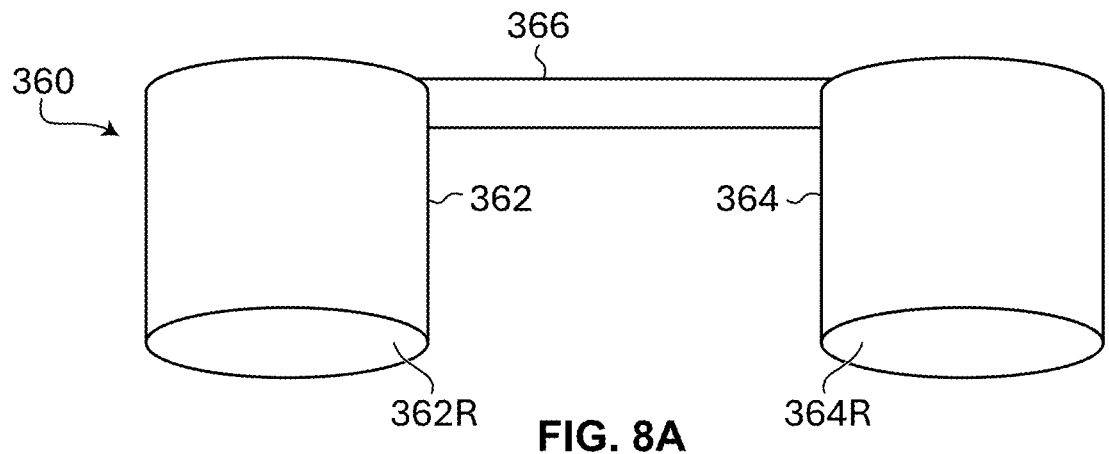
FIGS. 8A and 8B show perspective and top views of example embodiments of crossbar connectors.
Figure 8B:
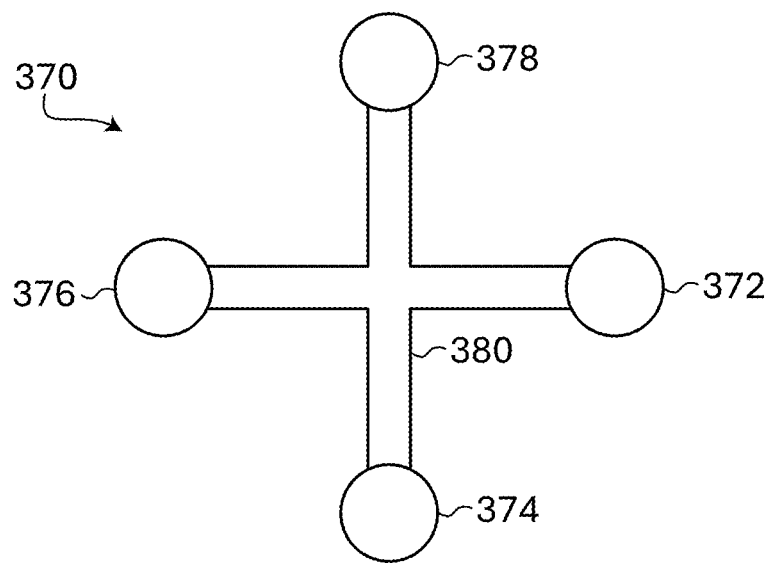

Referring now to FIGS. 8A and 8B, shown therein are perspective and top views of example embodiments of crossbar connectors 360 and 370, respectively. The crossbar connectors 360 and 370 can be used to couple vertical support bars and be placed at a desired height in order to hold termini in place or maintain a desired radius of curvature for turning fibers. The crossbar connectors may also generally provide structural support by bracing extended or cantilevered structures (e.g., since the modules of a diffusion network are oriented horizontally when the phantom is placed within an imaging scanner). The crossbar connectors may include caps that are connected by horizontal elements such as bars or rods. For example, the crossbar connector 360 includes caps 362 and 364 that are connected by a bar 366. The caps 362 and 364 have recesses 362R and 364R or cylindrical compartments, respectively, for receiving a free end portion of a scaffold component of a phantom, such as a free end portion of a vertical support post, which allows the crossbar connector 360 to more securely couple these scaffold components together. In some cases, an adhesive can also be used within the recesses 362R and 364R. The crossbar 370 has more caps in order to more securely couple more vertical scaffold components together and is used in a similar manner as crossbar connector 360. The crossbar 370 includes caps 372, 374, 376 and 378 with corresponding recesses (not shown), and a bar 380 having four arms to which each of the caps 372, 374, 376 and 378 are attached. It should be noted that the crossbars 360 and 370 can also be used to connect scaffold components that are horizontally oriented or oriented at an angle. In at least one embodiment, the crossbars (i.e., multiple) or the crossbar (i.e., single) may be optional. In at least one embodiment, at least one crossbar may not include the caps if the crossbar was placed at a vertical midpoint along a vertical support bar or at a connection point between two vertical support bars that are coupled together.

For alternative representations of termini, for example, representations of a fanning pattern, the phantom can include a holder that has a vice or window that has a shape that can be used to contain the fiber ends securely in a desired pattern for a fiber terminus.

The fibers that are used for the fiber networks in a phantom may be made of a certain material such as, but not limited to, a microfiber material, and can have a certain dimension that is chosen to give desired diffusion properties in a final phantom product, for example, by varying the length and/or cross-sectional area of the fiber. An example of a representative fiber may have a circular cross-section, which may be 0.5-10 microns in diameter. In at least one embodiment, the fibers may be homogeneous in diameter, with all strands of substantially equivalent diameter. Alternatively, in at least one embodiment, the fibers may be non-homogeneous, with strands with a range of diameters (e.g., about 0.5-2 microns). Alternatively, in at least one embodiment, there may be two or more fiber networks where one or more fiber networks have homogenous strands, and one or more fiber networks may have inhomogeneous strands. Similarly, the fiber may be of the same fiber type or a mix of types. The fiber may be made using various polymeric materials such as, but not limited to, polypropylene or polyethylene.

Anisotropic diffusion increases at the surface of the fiber and closely packed strands of fiber can be used to concentrate the amount of fiber surface area per volume. By varying the fiber or microfiber material type, the amount and extent of fiber surface area can be tuned to increase or decrease the magnitude of anisotropic diffusion signal during an image scanning protocol. A microfiber is a fiber with a circular cross-section on the order of micrometers such as about 0.5 microns or within a range of about 1-50 microns. An example of microfiber material is the Islands in the sea (INS) material, where multiple rods of polypropylene are supplied in a soluble Polyvinyl alcohol (PVA) sea.

Additionally, overlapping and intersecting nodes in the fiber network can be defined and their assembly steps codified by following instructions to loom the fiber. An overlapping node of a fiber network is when two or more fibers in the fiber network overlie one another but are vertically spaced apart so that they do not intersect (for example, see the image labelled 528 in FIG. 11B). An intersecting node of a fiber network is when two or more fiber edges pass through each other. A number of intersecting node types are possible with fibers intersecting at various angles between greater than 0 degrees and less than 180 degrees, where 0 degrees is a non-intersection. Further understanding of the function and form of the diffusion network can be realized through example descriptions and drawings provided herein. For example, FIGS. 11C-11G, shown therein are various examples of bifurcation and intersection modules that can be used to build a custom phantom in accordance with the teachings herein.

The outer housing comprises the housing 12 and the upper and lower plates 14 and 16. The outer housing of a phantom contains the internal structure and modules and facilitates additional utility. In one example embodiment, the main body of the housing 12 may be cylindrical and contain fiducial positions, debossed thereon, which during use receive fiducial markers, to support the registration of imaging data with a navigation system to transform different sets of image data into one coordinate system. For some use case scenarios, this allows for the image dataset and the hardware to be co-located in the same augmented-reality space. In at least one embodiment, the outer housing may include a port in its side wall, bottom plate or upper plate to allow the internal temperature of the phantom to be measured by inserting a thermometer through the port. The port may also provide a means for inserting medical devices such as, but not limited to, for example, a DBS (Deep Brain Stimulation) lead. In at least some embodiments, the outer housing may also be labelled with positioning information, such as head, nose, chin or foot end and include localization markers to verify certain positions.

In building a fiber network, various parameters are defined including:
A) the absolute positions of termini and nodes, their relative positions to each other, and the amount of fiber used to make each edge that are coupled to the one or more termini and/or one or more nodes;
B) node parameters including:
 1) existence and location of any bifurcations; and
 2) existence and location of any intersections including intersection type (e.g., partially intersecting, completely intersecting) and angle of intersection) and these positions located in the support plate 18 with a support post,
where each of these locations are defined on the support plate 18 with an aperture 19; and
C) a fiber origin which is a starting position on a support post of the scaffolding to create a desired fiber network with one continuous strand (multiple fiber networks may each contain a unique continuous fiber), or discontinuous strands (e.g., due to change of lot) or mixing two fibers at a time to double up the fiber amount dispensed in each step or obtain diffusion properties from having 2 fiber types in the network.

If the fiber that is used in the fiber network requires post-processing, which may be done, for example, in order to dissolve a component of the fiber, such as poly-vinyl alcohol (PVA) in a bicomponent fiber compromising a plurality of polypropylene strands held together in/by a soluble PVA domain surrounding the polypropylene (or other polymeric material), the fiber network may be arranged (e.g. woven along the scaffolding) by performing repeated steps of arranging the fiber such that portions of the fiber are off-set from one another along the Z direction (e.g. perpendicular to the support plate 18) to maximize the collective surface area of the fiber portions that are adjacent to one another. The fiber arrangement on the scaffold may then be immersed in a water reservoir, or ultrasound bath to dissolve the soluble component of the fiber. In at least one embodiment, gentle heat may also be added (e.g., 30-40 degrees Celsius) to accelerate the process.

The fiber material along each of the edges of the fiber network may be consolidated and contained within a common sheath, by removing the vertical support post at one terminus of the fiber network and placing a sheath along this edge section of fiber that is connected to the terminus to maximize the density of surface area per voxel when the phantom is imaged.

With termini and edges secured, a given intersection of two portions of a fiber may be constrained with a temporary securing mechanism, such as a cable-tie, after the support bar that was secured to the support plate 18 to define the position of the given intersection of the fiber network is removed, and the tension at the intersection is then adjusted by manipulating the fiber portions at the intersection, for example, by adjusting the tension along the edges near the intersection by adjusting the position of the sheath along those edges accordingly (e.g., by pushing the sheath toward an intersection), by incorporating a twist in the fiber portions along those edges, by adjusting the angle of the intersection and/or the end position of the terminus (e.g. by removing the support post for the terminus and moving it to a different location on the support plate). These fiber manipulations, including applying the sheath, may be referred to as secondary steps.

After all of the manipulations, or secondary steps, are performed to construct a fiber network with desired properties (i.e. node and termini locations and adjusting fiber tension for one or more of the edges), the support plate 18 and the upright scaffold (comprising any combination of vertical support bars, isotropic diffusion modules, anisotropic diffusion modules, and perfusion modules), with the desired fiber network in place is placed within the outer housing 12 of the phantom and secured to the bottom plate 16 using the spacers 20, 20a and 20b. Examples of combinations of a fiber network with anisotropic diffusion modules is shown in FIGS. 1A, 1B and 2B. A phantom matrix fluid of water, or an aqueous solution of water with a germicidal agent, is then used to fill the interior of the phantom. The top plate 14 can then be releasably fixed to the upper portion of the housing 12. It should be noted that there may be many different types of phantoms that can be constructed according to the teachings herein including various combinations of one or more isotropic modules, fiber networks, perfusion modules and anisotropic diffusion modules.

Diffusion Network Assembly Instructions

A fiber network supports anisotropic diffusion along the directions of its edges, and through any intersections and bifurcations in the fiber network as defined by the construction of these intersections. A fiber network may be referred to as an anisotropic diffusion module, and it is held in position by the arrangement of the support plate, the support posts and possibly crossbars. The support plate and the support posts may be collectively referred to as a scaffold for the anisotropic diffusion module. Accordingly, a scaffold can include: (a) a support plate, (b) at least one support post, and optionally (c) at least one crossbar connector. It should be noted that crossbars are optional if additional support for the fiber network is not needed or necessary.

If a phantom does not include an anisotropic diffusion module, then a scaffold is not needed for the phantom. An isotropic diffusion phantom includes one or more isotropic diffusion modules arranged on the support plate. An anisotropic phantom includes at least one anisotropic diffusion module, and optionally at least one isotropic diffusion component and/or at least one perfusion module. A perfusion phantom contains at least one perfusion module.

When creating an anisotropic diffusion network, primary processing steps are performed to locate the various components of the scaffolding at desired locations and arrange the fiber network along the scaffolding to follow a desired network pattern. Post-processing steps may then be applied to the fiber material in order to change its material properties, e.g., in the case of a bicomponent fiber containing polypropylene filaments in a soluble polyvinyl alcohol (PVA) domain, the fiber network as arranged in the primary processing steps may be immersed in water to dissolve the PVA component. Secondary processing steps may then be applied to the fiber material to provide the various edges, termini, and nodes with certain characteristics so that the diffusion network has the desired diffusion properties. Examples of secondary processing steps may include application of a sheath to an edge, and/or adjusting the tension in a fiber edge.

Disclosed herein is at least one example embodiment of a set of instructions, compromising sequential steps, that can be executed to create a desired network pattern for an anisotropic diffusion network fora phantom, where the instructions result in the anisotropic diffusion network having desired and specific properties for each intersection, edge and terminus in the network. These instructions may include selecting lengths of edges, selecting intersection types, selecting positions of nodes, selecting an origin position for constructing the fiber network and any other instructions used to define the anisotropic diffusion network.

These instructions can be used to generate a plurality of anisotropic diffusion networks having equivalent properties. Thus, multiple copies of a phantom product may be manufactured with anisotropic diffusion modules, for example, that are equivalent, allowing diffusion weighted MR datasets taken from different MR units to be directly compared.

Additionally, machine readable information can be gleaned from the binary pattern (e.g., a binary code) in the support plate that verifies the intended properties of the modules contained within the phantom product (e.g., or on the support plate). By having unique binary patterns, unique product units can be identified and tracked throughout their usage.

A desired pattern of anisotropic diffusion may be described and defined through following a network diagram methodology, which includes defining any edges, intersections, nodes and their physical characteristics and then following a sequential program of stepwise instructions to create the physical anisotropic diffusion network.

Figure 9:
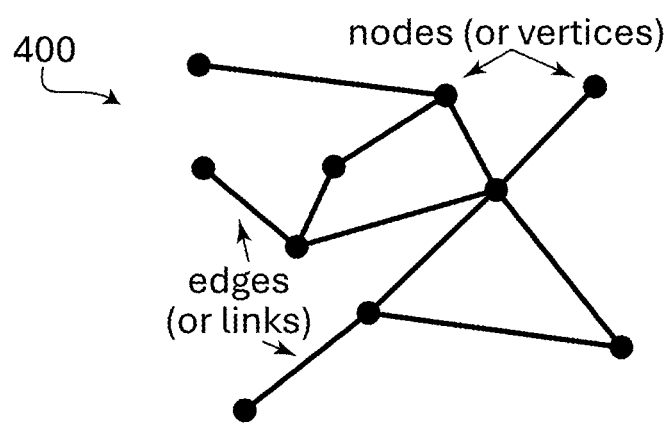
FIG. 9 shows a schematic of an example of a mathematical network that can be used to represent a fiber network used in a phantom.

For example, referring now to FIG. 9, shown therein is a schematic of an example of a network 400 that can be used to represent a fiber network that may be used in a phantom. A mathematical network is defined by edges, nodes and termini positions and their positions with respect to each other. In the case of a fiber network, the end of the fiber network can be defined as a terminus (collectively "termini"), bifurcations and/or intersection in fibers can be defined as nodes and the fiber tracts between termini and nodes can be defined as edges.

Example 1

Figure 10A:
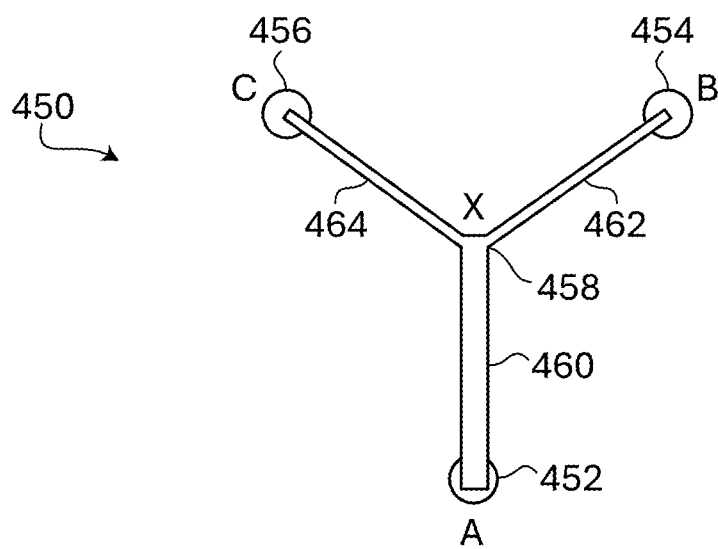
FIG. 10A shows a schematic of another example of a fiber network for constructing a phantom having anisotropic diffusion.
Figure 10B:
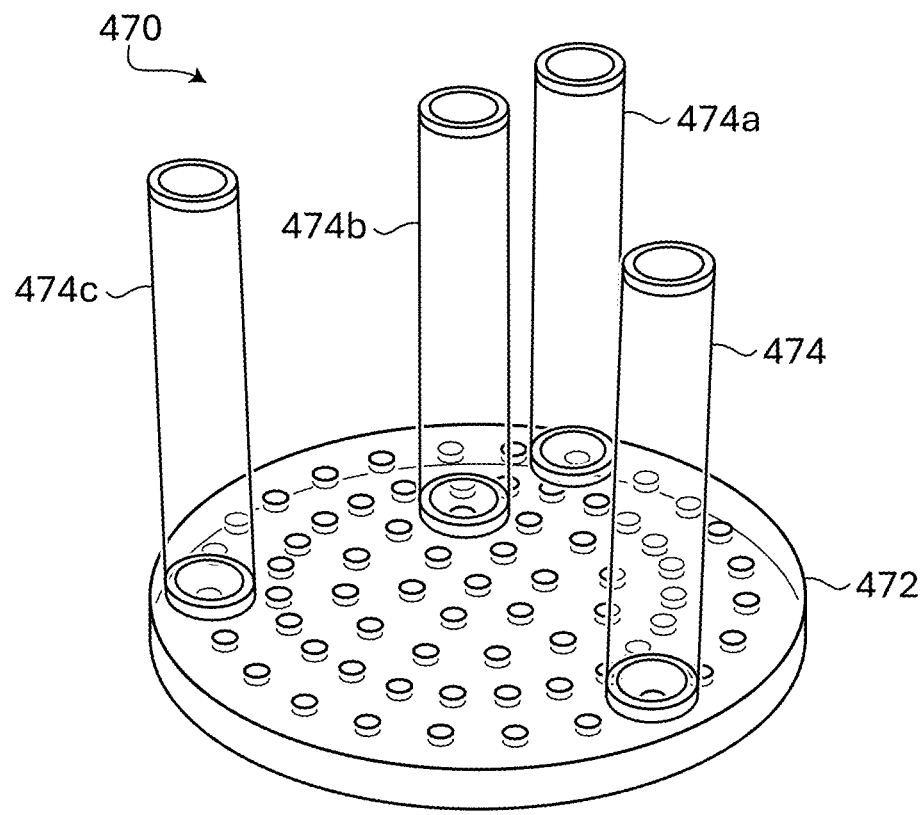
FIG. 10B shows an assembly of isotropic diffusion modules on the axial support plate.

Referring now to FIG. 10A, shown therein is a schematic of an example of a fiber network 450 for constructing a phantom having anisotropic diffusion. The fiber network 450 includes 3 termini 452, 454 and 456 at locations A, B, and C, a node 458 located at position X and edges 460, 462 and 464. Referring now to FIG. 10B, the fiber network 450 can be made by placing 4 vertical support posts 474, 474a, 474b and 474c at positions A, B, C and X on a support plate 472 and fixing a fiber or microfiber material at a chosen origin position, for example by using an interference fit between the upper surface of a first support post and the lower surface of a second support post which are arranged vertically as a 2-part vertical support post, or a through hole made in a vertical support post and using a suitable knot or adhesive, or combination of processes, for securing one end of the fiber or microfiber thereat. For example, the origin position may be chosen to be at location A.

Figure 10C:
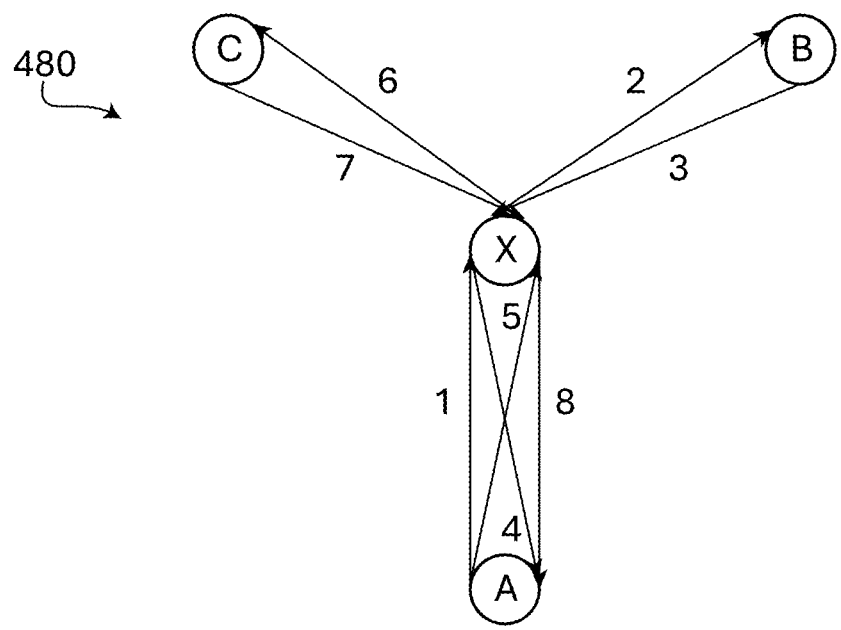
FIG. 10C shows a weaving pattern for constructing the fiber network of FIG. 10A.
Figure 10D:
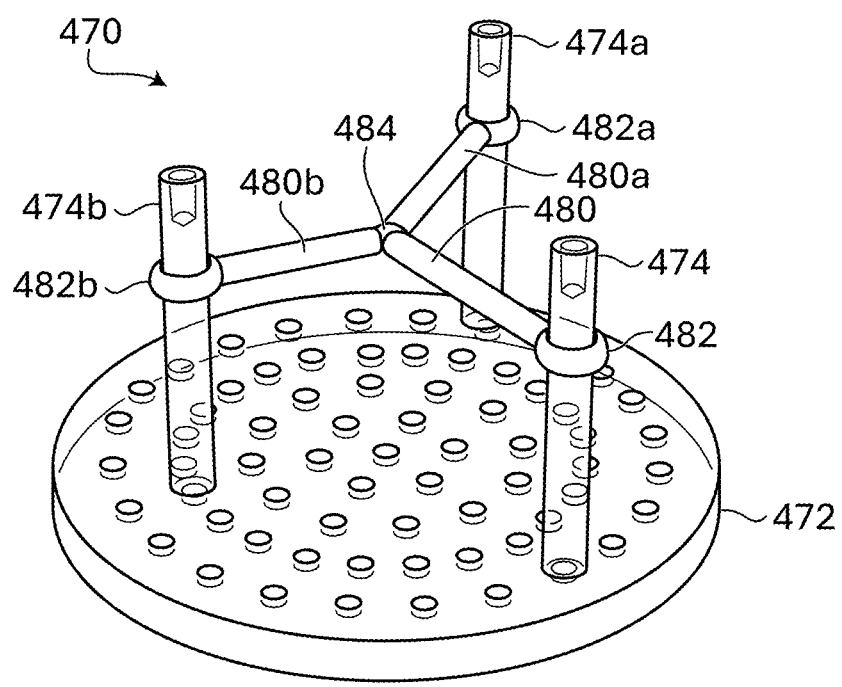
FIG. 10D is shows a perspective view of an axial support plate with a constructed anisotropic diffusion module using the fiber network of FIG. 10A.

The fiber or microfiber may be woven in a pattern to create the network comprising the node at location X, the termini at locations A, B and C, and the edges |AX|, |BX| and |CX| as well as the relative weighting between these edges. For example, where edge |AX| splits equally at node X, between |BX| and |CX|, the weaving pattern can be followed as shown graphically in FIG. 10C and described in Table 1. Steps 1-8 can be repeated to create fiber networks with greater amounts of fiber and larger diameters.

TABLE 1

Steps for creating the network 450

| Step | Weaving Directions with fiber starting at A |
|---|---|
| 1 | From the origin at A to X, passing clockwise around X |
| 2 | From X to B, looping about B |
| 3 | From B to X, passing anti-clockwise around X |
| 4 | From X to A, passing clockwise around A |
| 5 | From A to X, passing anti-clockwise around X |
| 6 | From X to C, looping around C |
| 7 | From C to X, passing clockwise around X |
| 8 | From X to A looping around A |

For a different weighting ratio between two edges, such as 75%:25% for the ratio of edges |BX|:|CX|, steps 1 to 4 may be repeated 3 times for every 1 execution of steps 5 through to 8.

An example of the fiber network at this point is shown as fiber network 470 in FIG. where edges |AX|, |BX| and |CX| are represented by fiber portions 480, 480a and 480b and node X is represented by fiber intersection 484.

The weaving steps described in Table 1 can be referred to collectively as the primary fiber network assembly process.

More complex splitting patterns may be possible if termini B and C were nodes from which the fiber is further split into a plurality of smaller branches.

Secondary Processing Steps

The processing steps described in the paragraphs in this section can be collectively referred to as secondary processing steps.

In some cases, the fiber being used to create the diffusion network pattern requires postprocessing such as, but not limited to, applying chemical processing to the fiber. For example, when a bicomponent fiber called islands-in-the-sea fiber is used, which includes micro rods of polymeric material that are encapsulated in a water soluble PVA material, post-processing can be performed by exposing the fiber network to water in order to dissolve the water soluble PVA material. This may be done so that the micro-rods of polymeric material can be arranged to adjust the tension along one or more edges of the fiber network. For example, the positions A, B, C and X can be defined within a common plain, and repeated weaving steps may be offset in a direction perpendicular to this plain (e.g., see step 528 in FIG. 11B), to maximize the surface of the fiber material that is available for the post-processing steps.

Continuing with the example of FIG. 10B, the support plate 472 along with the support posts 474, 474a, 474b, and 474c holds the edges of the fiber network in place, allowing them to be manipulated individually. For example, the sections of fiber deposited by steps 1, 4, 5 and 8 in Table 1 may be adjusted, by collapsing the fiber or microfiber edges to a single, larger network edge |AX|, removing the vertical post 474b at position A, enclosing the network edge |AX| in a sheath and reinserting the vertical support post 474b through the fiber loop at position A and reattaching the vertical support post 474b to the support plate 472.

For a fiber material where postprocessing changes the tension in a fiber along an edge of the network, the tension can be adjusted, by removing a vertical support post from a given location on the support plate representing a terminus of the fiber edge, rotating the vertical support plate to introduce a twist in the fiber edge, and replacing the vertical support post at the given location in the support plate. Additionally, in order to maintain or adjust tension in a portion of the fiber network, the diameter of the support post(s) adjacent to this portion of the fiber network may be changed.

Example 2

Figure 11A:
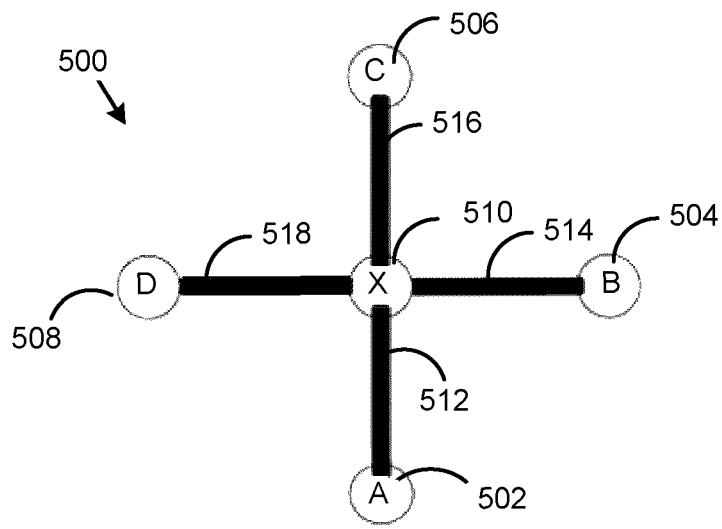
FIG. 11A shows a schematic of another example of a fiber network for constructing a phantom.
Figure 11B:
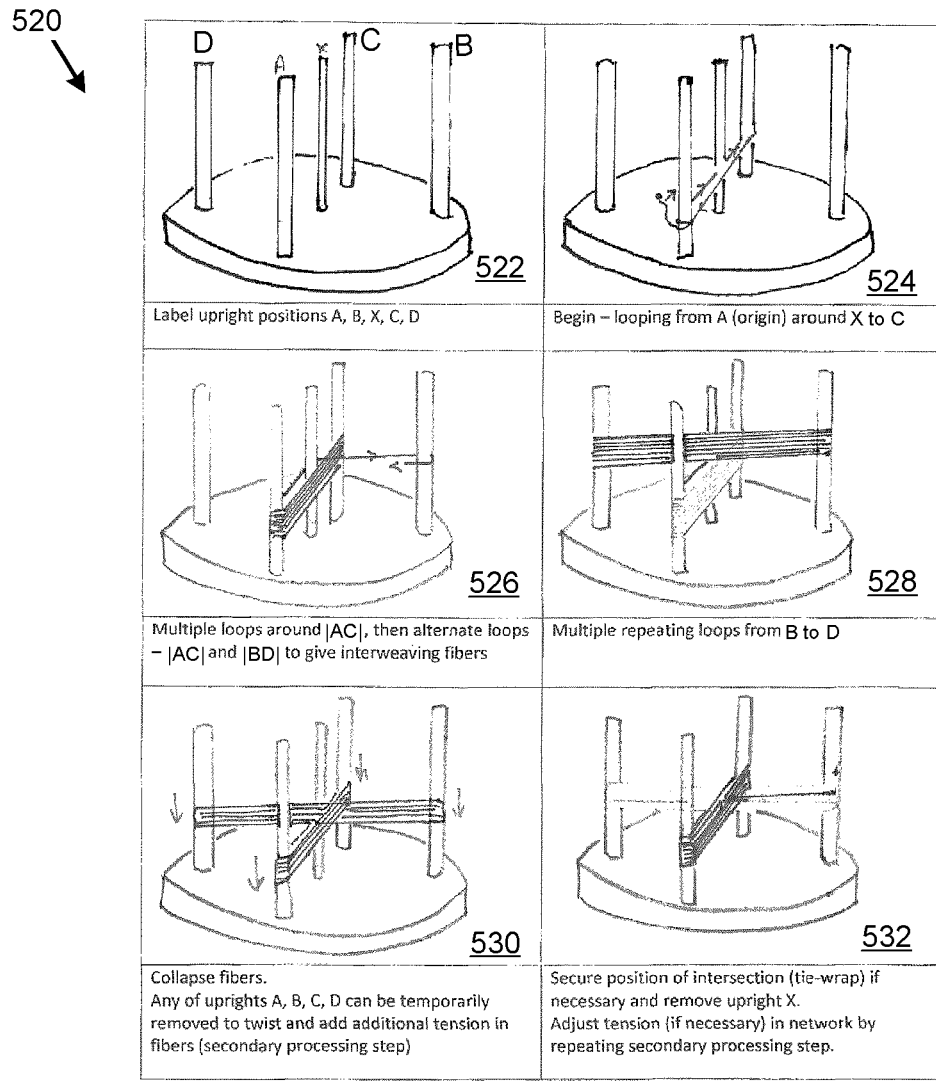
FIG. 11B graphically shows the steps for constructing the example fiber network of FIG. 11A.

In example 2, a fiber network 500, a schematic of which is shown in FIG. 11A, can be described as having 4 termini, at locations A, B, C, D intersecting at a node at location X and having edges |AX|, |BX|, |CX| and |DX|. More options exist for defining this intersection X. Vertical support posts 502, 504, 506, 508 and 510 are placed at apertures on the support plate at locations corresponding to the positions of A, B, C, D and X. Instructions 520 for forming the fiber network 500 are shown in FIG. 11B in which first step 522 involves placing the support posts at the locations A, B, C, D and X.

Weaving then begins by defining the support post 502 at location A as an origin point, wrapping an end of the fiber around support post 502 and then proceeding to wrap the fiber around support post 506 at location C as shown in step 524. For a fiber network with a touch point at node X, where fibers touch or kiss at node X, and are of equal weight N, the weaving may involve weaving N loops of the fiber clockwise around both the support posts 502 and 506 at positions A and C to form the edge |AC|, followed by weaving |AXB| clockwise around the support post 510 at location X and then around the support post 504 at location B as shown in step 526. The weaving then involves weaving N loops of the fiber clockwise around the support posts 504 and 508 at locations B and D to form the edge |BD| as shown in step 528. For suitably large values of N, the effect of weaving |AXB| clockwise around the support post 510 at position X, is minimal.

For a diffusion network pattern, as shown in FIG. 11A for example, that can be described as having 2 intersecting diffusion edges (i.e., 2 intersecting fibers) where a first edge |AC| is between termini positions A and C and a second edge |BD| is between termini positions B and D intersecting at an intersection node located at position X, the fiber assembly instructions, with an origin position at A may be defined as follows:

1. form edge |AC|, by starting at the support post 502 at location A and then looping the fiber clockwise around the support post 506 at location C;
2. form edge |CA|, by looping the fiber clockwise around the support post 502 at location A;

3. form edge |AX|, by looping the fiber clockwise around the support post 510 at location X;
4. form edge |XB|, by looping the fiber clockwise around the support post 504 at location B;
5. form edge |BD|, by looping the fiber clockwise around the support post 508 at location D;
6. form edge |DB|, by looping the fiber clockwise around the support post 504 at location B;
7. form edge |BX|, by looping the fiber anticlockwise around the support post 510 at location X; and
8. form edge |XA|, by looping the fiber clockwise around the support post 502 at location A, where steps 1 and 2 can be repeated N times to create a larger edge |AC|; steps 3 and 4 are performed once; steps 5 and 6 can be repeated M times to create a larger edge |BD|. The integers M and N may vary from 1 up to about 1,000 to 10,000 or more to increase the thickness of the fiber edges as desired. If M equals N, then equal sized fibers are built for edges |AC| and |BD|.

An offset interweaving node may be created by combining the touching and weaving operations. An example of a touching operation is when fiber edges are located beside one another and then collapsed into a fiber edge, an example of which is step 530 in FIG. 11B. An example of an interweaving operation, is when an interweaving node is created at a location, such as location X by dispensing fiber repeatedly from the support post 502 at location A to the support post 506 at location C, and from the support post 506 at location C back to the support post 502 at location A, before following the interweaving operations described above, followed by repeated loops from the support post 504 at location B to the support post 508 at location D, and then back from the support post 508 at location D to the support post 504 at location B.

For this example, the interweaving fibers pass straight through the intersection, with an intersection angle of 90 degrees, but the fibers may turn 90 degrees at the intersection so that instead of an intersection of edge |AC| with edge |BD|, an intersection of edge |AB| with edge |CD| may be achieved, where each of edges |AB| and |CD| contain a 90 degree angle at the intersection X. By interchanging the assembly steps of the diffusion network, the nature of the intersection of different tracts of nervous structures can be modelled, and the angle of intersection can be controlled for different edges of modelled and idealized structures.

Additionally, in alternative embodiments, a plurality of different angles can be implemented in a fiber network.

For example, referring now to FIG. 11C, shown therein is an example of a phantom that includes three modules: a 180-degree intersection network (e.g., FIG. 11F) and a 90-degree intersection network (e.g., FIG. 11G) on a bottom tier of the phantom and an asymmetrical bifurcation network (e.g., FIGS. 11D and 11E) on a top tier of the phantom. Module ABCD is a 180-degree crosshair with fibers passing straight through the intersection point. Branch AX=55 mm in length, ¼ inches in diameter, and includes 48,000 fibers; Branch BX=20 mm in length, ¼ inches in diameter, and includes 48,000 fibers. Branch CX=14 mm in length, ¼ inches in diameter, and includes 48,000 fibers. Branch DX=25 mm length, ¼ inches in diameter, and includes 48,000 fibers. Module EFGH is a 90-degree crosshair with fibers making a 90-degree turn at the intersection point. Branch EX=23 mm in length, ¼ inches in diameter, and includes 36,000 fibers. Branch FX=55 mm in length, ¼ inches in diameter, and includes 36,000 fibers. Branch GX=16 mm in length, ¼ inches in diameter, and includes 36,000 fibers. Branch HX=25 mm in length, ¼ inches in diameter, and includes 36,000 fibers. The asymmetric bifurcation module includes a branch AX=60 mm in length, ¼ inches in diameter, and includes 174,000 fibers; a branch BX=48 mm in length, ¼ inches in diameter, and includes 78,000 fibers; a branch CX=38 mm in length, ¼ inches in diameter, and includes 48,000 fibers; and a branch DX=50 mm in length, ¼ inches in diameter, and includes 48,000 fibers.

Referring now to FIG. 11D, shown therein is an example embodiment of a bifurcation model construction which includes branch A-X with 1450 loops and 174,000 fibers, branch B-X with 650 loops and 78,000 fibers, branch C-X with 400 loops and 48,000 fibers and branch D-XX with 400 loops and 48,000 fibers. FIG. 11E shows an example of an actual bifurcation model that corresponds to the model shown in FIG. 11D.

Figure 11H:
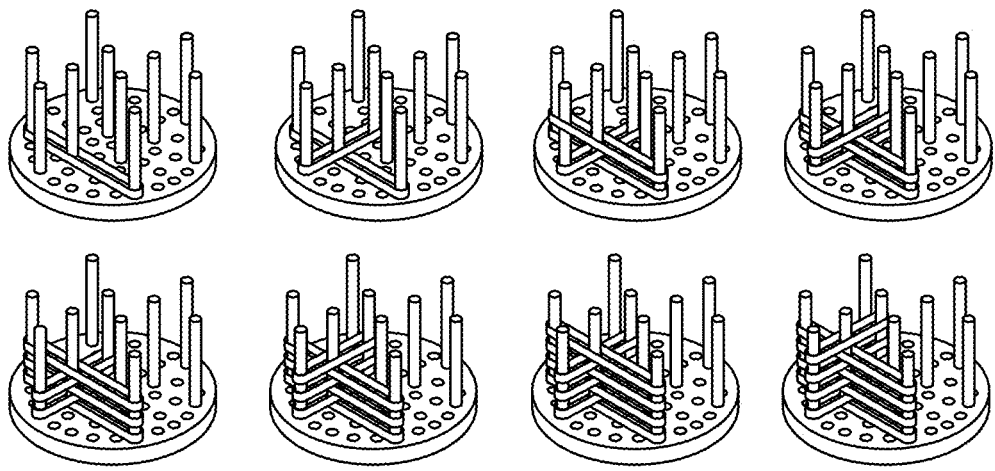

Referring now to FIG. 11F, shown therein is an example embodiment of a 180-degree intersection model that may be used with a phantom in which the fiber networks are arranged vertically and horizontally. The 180-degree intersection model includes branch A-X with 400 loops and 48,000 fibers, branch B-X with 400 loops and 48,000 fibers, branch C-X with 400 loops and 48,000 fibers and branch D-X with 400 loops and 48,000 fibers. A step-by-step method of constructing the 180-degree intersection model is shown in FIG. 11H.

Figure 11I:
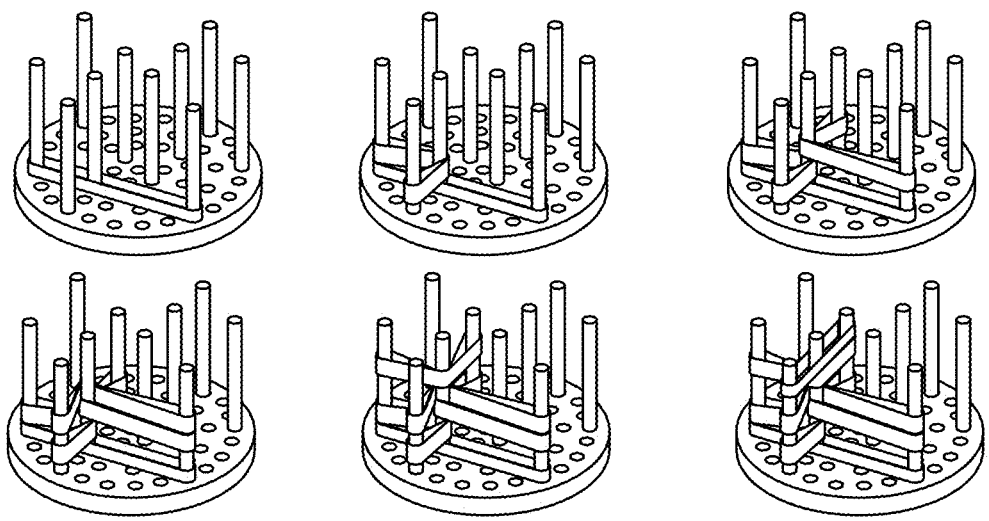

Referring now to FIG. 11G, shown therein is an example embodiment of a 90-degree intersection model that may be used with a phantom in which the fiber networks are also arranged vertically and horizontally but wrap around some of the support posts with 90-degree bends in some cases. The 90-degree intersection model includes branch E-XX with 300 loops and 36,000 fibers, branch F-XX with 300 loops and 36,000 fibers, branch G-XX with 300 loops and 36,000 fibers and branch H-XX with 300 loops and 36,000 fibers. A step-by-step method of constructing the 180-degree intersection model is shown in FIG. 11I.

In at least one embodiment, the weaving operations may be performed by a machine according to software instructions.

Example 3

Figure 12A:
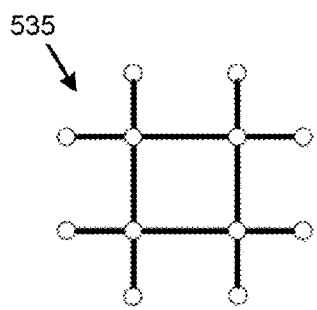
FIGS. 12A and 12B show schematics of example fiber networks having multiple intersections and possible intersection types as well as different intersection angles between fiber edges.
Figure 12B:
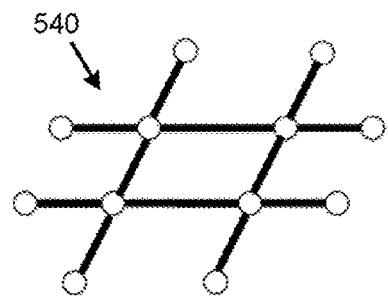

By extrapolating from example 2 above, more complex network patterns can be created with a plurality of intersection types present within the same fiber network. Schematics for examples of such fiber networks are shown in FIGS. 12A and 12B as fiber networks 535 and 540, respectively. Additionally, fiber networks can be assembled independently and through secondary processing steps combined onto the same scaffold structure. Accordingly, a scaffold structure that compromises the support plate and vertical support posts can be used to hold a plurality of diffusion network modules.

Example 4

Figure 13A:
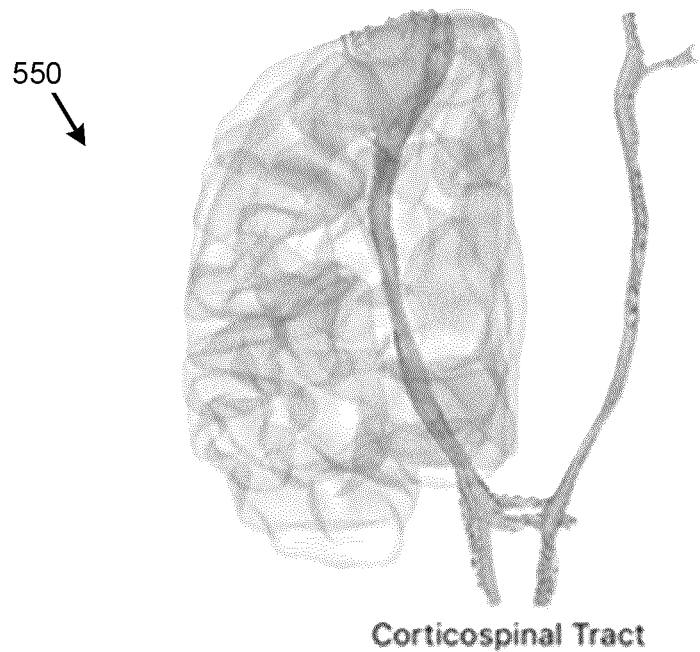
FIG. 13A shows physiological fiber networks for a corticospinal tract.
Figure 13B:
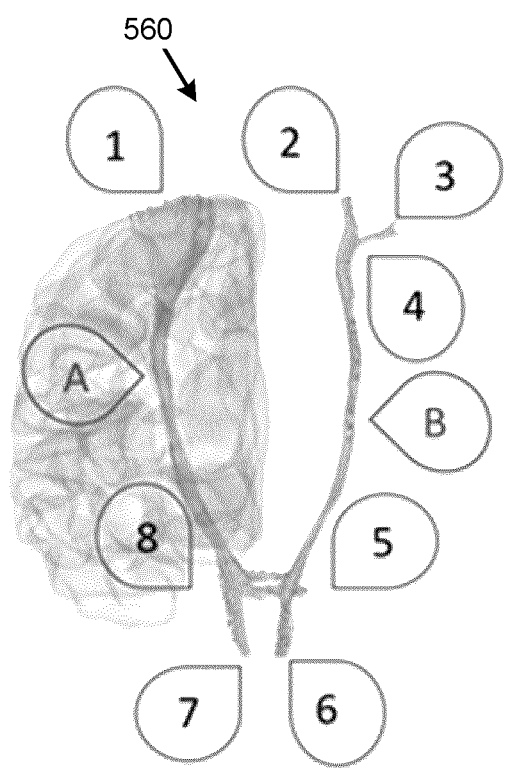
FIG. 13B shows an example of mapping used to convert physiological fiber networks to a phantom fiber network.
Figure 13C:
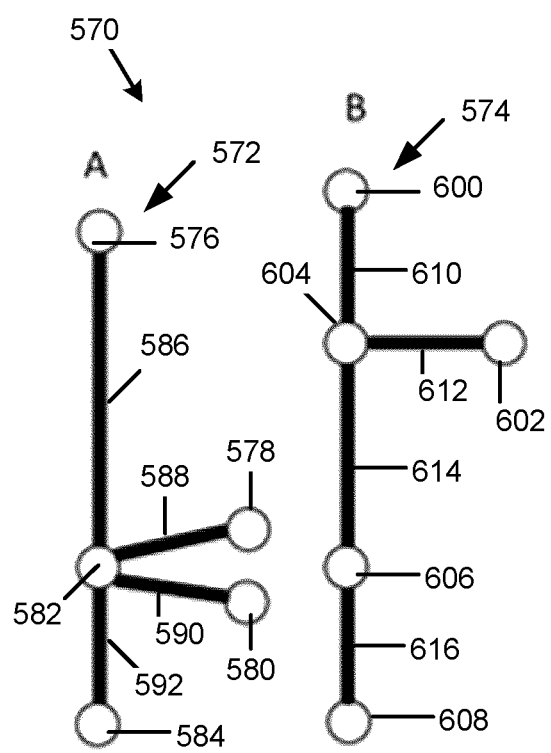
FIG. 13C shows fiber networks resulting from the mapping of FIG. 13B.
Figure 14:
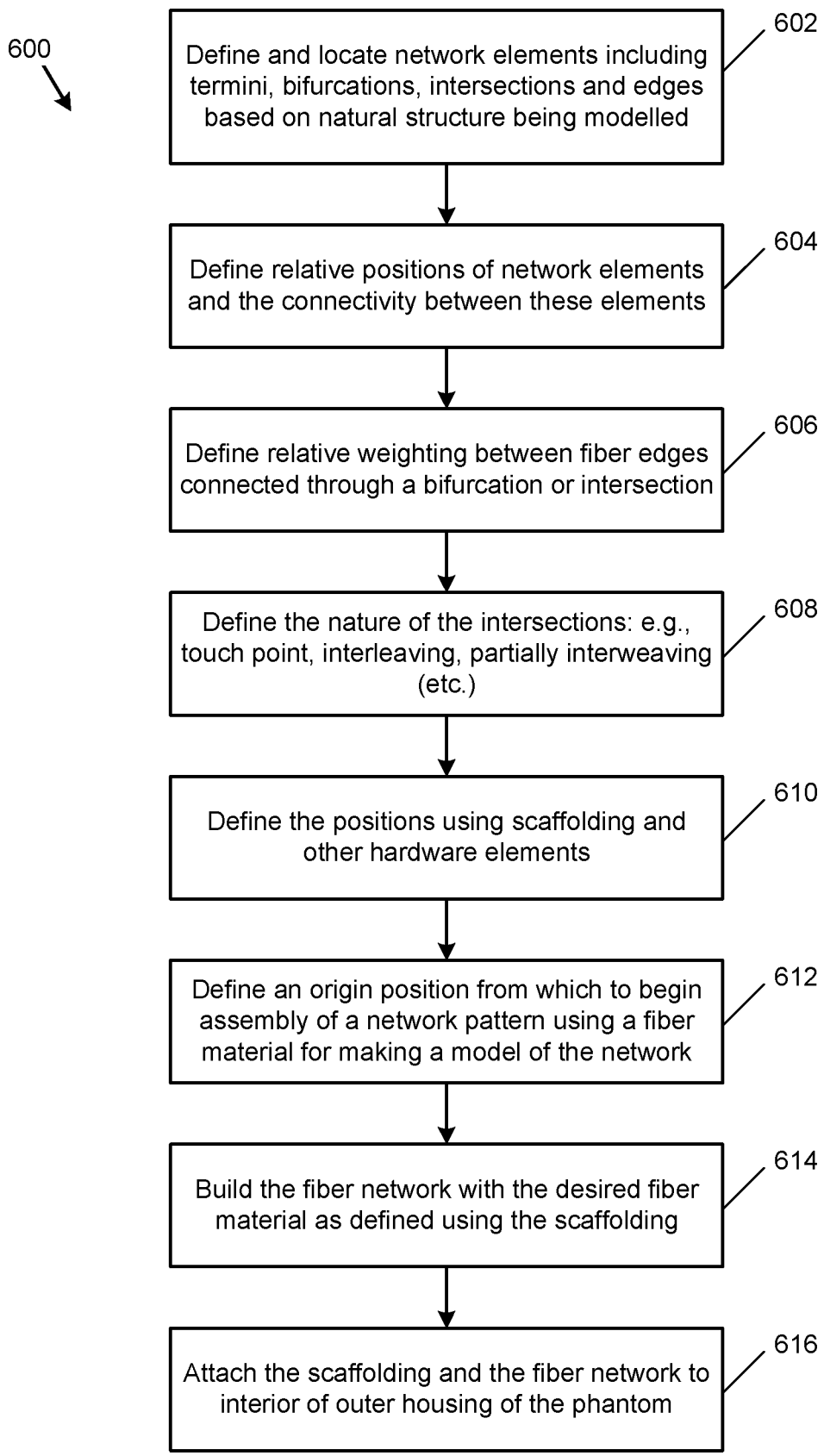
FIG. 14 shows a flowchart of an example embodiment of a process of constructing a phantom to model a natural physiological structure.

Examples 1, 2 and 3 describe ideal structures. In this example, a natural physiological structure may be modelled, such as a human corticospinal tract 550 shown in FIG. 13A, by defining the locations and connectivity of certain elements such as the 8 elements shown in FIG. 13B, and these elements are then converted into 2 simple networks A and B as shown in FIG. 13C that can be used to build fiber networks using the methods described above. FIG. 14 shows a flowchart for an example embodiment of a method 600 that can be used to create a phantom using the network diagram shown in FIG. 13C. The elements that are defined for the natural physiological structure shown in FIG. 13B include termini (1, 6, and 7), bifurcations (4, and 8), and intersections or touch points (5). Step 602 of method 600 is first performed which involves defining and locating network elements including the termini, at least one bifurcation, at least one intersection and at least one edge that are used in a fiber network for modelling the natural structure. Depending on the natural physiological structure, the at least one intersection and the at least one bifurcation may be optional. Step 604 of method 600 is then performed which involves defining relative positions of network elements and the connectivity between these elements. For example, connectivity between the 8 elements of FIG. 13B are defined with edges in FIG. 13C to biomimic the same connectivity found in the natural structure. Step 606 of the method 600 is then performed to choose the properties of the bifurcations by defining a relative weighting between fiber edges connected through a bifurcation or intersection and the weightings are assigned to different edges. Different weights for edges can be implemented by varying the quantity of fiber in the edges thereby varying the amount of surface area of the fiber contained within a given edge element of the fiber network. Step 608 of the method 600 is then performed which involves defining the nature of the any intersections that are used such as, for example, whether the intersections are a touch point, are interleaving, are partially interweaving, or are completely interleaving. For example, the bifurcation 4 in FIG. 13B can be made using a 50:50 distribution of the fibers at termini 2 and 3 in FIG. 13C. Step 610 of the method 600 is then performed in which these positions are defined within the hardware model (i.e., the scaffolding structure and optionally any diffusion modules). Steps 612 and 614 of the method 600 are performed to define an origin position from which to begin assembly of a network pattern using a fiber material for making a model of the network and then apply the fiber to the scaffolding using the desired fiber material and following weaving instructions, such as those shown in Examples 1 and 2 for example, to build a diffusion network for a phantom that mimics the targeted structure shown in FIG. 13A. For this particular example, the end of the network A at position 1 can be placed within an enclosure, such as a holder that has a vice or window for example, as explained earlier, that constrains its position to create the fanning terminus of the structure being modelled.

Once an anisotropic diffusion network or collection of anisotropic diffusion networks is assembled, the method 600 proceeds to step 616 where the scaffold including the support plate and vertical support posts along with the fiber network(s) are attached to the interior of an outer housing of a phantom. The interior of the outer housing may then be filled with water, or another aqueous solution and the upper support plate then secured to the outer housing to complete the phantom.

Matrix Material

The material that fills the outer housing is referred to as an aqueous matrix material. The aqueous matrix material can be a fluid such as water, or an aqueous based solution of a salt such as copper sulphate, or another aqueous material, or may contain a germicidal agent, for example. The interior of a phantom is filled with liquid. A small bubble may be left in each domain that can absorb pressure changes that result from temperature variations of the liquid which may occur during transport and storage. The term "domain" refers to isolated continuous volumes within a phantom. For example, the inner space of a phantom that contains the aqueous matrix material can be considered to be a first domain, the interior of an isotropic diffusion module can be considered to be a second domain, the interior of a perfusion module, including the interior of the tubing connecting the perfusion module to the outside of the outer housing can be considered to be a third domain. During MR imaging, the presence of the fluid and the directionality of diffusion are recorded in MR images. Diffusion of fluid is the movement of molecules, which can be characterized as being isotropic (i.e., the fluid molecules move in all directions equally) or anisotropic (i.e., the fluid molecules move with a particular directionality within the fiber network).

Usage Examples of Phantoms Made Based on the Teachings Herein

Diffusion phantoms as described in this present disclosure can be used as a calibration instrument for various diffusion-weighted magnetic resonance imaging (DW-MRI) modalities.

Since phantoms constructed according to the teachings herein have a defined structure, with known properties including lengths of edges, and known intersection types this allows for repeatable accuracy, and precision and artifact evaluation when assessing the datasets obtained by applying the DW-MRI imaging protocols to these phantoms.

In another aspect, the phantom can be used to assess algorithms that post-process the primary image data created in the diffusion imaging process and validate the result, for example, whether processing software correctly interpreted the primary image data describing an intersection to output the correct path of the fibers through the intersection. This may potentially validate magnetic resonance scanning protocols and validate the methods that show which areas of the brain are connected, how and by what pathway they are connected, and the extent of the connection.

To approximate white matter with different diffusion characteristics, fiber material, or microfiber material with different diffusion characteristics (such as larger diameter, smaller diameter and mixed diameters) may be used to adjust the amount of fiber surface area and water within each voxel of image data and the degree to which diffusion of water is restricted. By varying the dimensions of the material used for the fiber, such as the diameter of the material, properties of different tissue types, such as white matter, may be modelled, including healthy tissue, disease states, and developmental states, in different phantoms, or as modules within the same phantom.

As described previously, access ports within the side wall, top plate or bottom plate of the outer housing may allow for placement of medical devices, such as a Deep Brain Simulation (DBS) lead, to probe for changes in the obtained image data as a result of varying the proximity of the medical devices to portions of the phantom that simulates fiber tracts. Through the process of scanning medical devices and anisotropic diffusion networks, the effects of placement of medical devices and implants on the ability to image patients post medical procedure may be evaluated and quantified, and changes predicted and accounted for in the development of medical devices. Also, the interpretation of scanning results from patients with these medical implants may be better predicted and interpreted.

Utility of Representing DTI Using a Set of Parameters

DTI is a representation of a nervous structure that is derived from the estimation of diffusion pathways of water molecules. Conventionally, a complete representation of such nervous structure requires high upfront computational cost to model various pathways of water molecules. This challenge is further compounded by the large storage requirement for storing the generated 3D representation. Such a large storage requirement limits the ability to store a large number of such representations of different human or animal subjects/patients. Such large storage requirements limit the number of transmissions due to the time required for each transmission, and/or the capacity of a system. It also limits efficient transmission of such representation of nervous structures since a larger amount of data would need to be electronically transmitted between devices such as, but not limited to, at least two of the following devices: a data store, a server and a user device like a desktop computer, a laptop, a tablet and a smartphone, for example. For this reason, standard medical image representation formats such as DICOM create 2D slices of such 3D representations and each 2D slice is stored as a mere bitmap image. An alternate representation that can preserve requisite structural and direction information is the use of a parametric representation (e.g., a parametric model) that models salient structural elements. As explained in Example 4 (above), the following network elements can be used to model a connected set of nervous structures:

Termini,
Lengths,
Intersections,
Relative position of intersections,
Intersection types, and
Density of each network connection.

Hence, representation of several fine structures can be replaced with a predetermined number of parameters using a mapping process, an example of which was shown in Example 4. It is understood that such modeling results in loss of fidelity; however, high fidelity may not be necessary for all clinical and research applications. For example, if a researcher is exploring the ability of a certain drug to prevent further deterioration of nerve connections in the frontal lobe due to dementia, or the effects of another drug such as an Alzheimer's, Parkinson's or MS drug, he/she does not require the complete DTI representation of the entire brain to track the establishment of such efficacy over the course of administering a certain drug therapy. This parametric representation of complex DTI can be considered as lossy data compression as the amount of information required to represent certain structural information in the brain is reduced to a finite set of parameters. Storage and transmission of a parameterized representation of a nervous structure is more efficient than representation of the complete DTI information. Also, the lossy compression can be slight or moderate adjacent to the area of interest, and further compressed further from the site of interest. This can be represented by using a series of parametric models, with different degrees of complexity at different distances from an area of interest, to reduce a file size needed to store DTI information (or DWI information as the above also pertains to DWI). This method is also similar to estimating the network topology of the nervous structure with a limited set of allowable topology elements.

In at least one embodiment, at least one extension plate is used in cases where a larger fiber network has a primary network pattern that is larger than the support plate in its primary arrangement. In these cases, the one or more extension plates are used along with the support plate to construct the larger fiber network, and the network can then be physically manipulated through secondary processing steps to arrange the desired/intended fiber network in a desired 3D pattern which fits on a support plate (e.g., plate 18) for placement within the outer housing. The geometry of the fiber network is secured into its final arrangement. The support plate along with the fiber network are then placed within the outer housing of the phantom.

While the applicant's teachings described herein are in conjunction with various embodiments for illustrative purposes, it is not intended that the applicant's teachings be limited to such embodiments as the embodiments described herein are intended to be examples. On the contrary, the applicant's teachings described and illustrated herein encompass various alternatives, modifications, and equivalents, without departing from the embodiments described herein, the general scope of which is defined in the appended claims. For example, different shapes and sizes can be used for any of the housing of the support posts, the isotropic diffusion module, the spacers, and the perfusion diffusion module as well as the outer housing of the phantom. Also, the outer housing of phantoms constructed according to the teachings herein may be made using different diameter cylinders, and alternative shapes to represent different physiological structures such as a head, a torso, or section of, or portion of a spinal column, of a human or other type of animal such as a dog, a cat or a horse, for example.

The invention claimed is:

1. A phantom for use in MR imaging, wherein the phantom comprises:

an outer housing defining an interior volume;

at least one support plate mounted in the interior volume of the outer housing and having a first surface with a plurality of connection locations for selectively receiving a connector of at least one element allowing for configurable phantoms to be created;

the at least one element being (a) at least one isotropic diffusion module, (b) at least one anisotropic diffusion module, (c) at least one perfusion module, or (d) any combination of (a), (b), and (c), the connector of each of the at least one element being releasably matingly connected at one or more of the plurality of connection locations on the first surface of the support plate; and a matrix material contained within the outer housing, the matrix material being an aqueous fluid, wherein during MR imaging, the presence of the aqueous fluid, and directionality of fluid molecular diffusion within or through the at least one element are recorded in MR images.

2. The phantom of claim 1, wherein the at least one isotropic diffusion module has a main body with first and second end portions, the first end portion having a sealing cap, the second end portion having the connector and the body containing a fluid, wherein the connector is adapted to releasably engage the first surface of the at least one support plate.

3. The phantom of claim 2, wherein the at least one isotropic diffusion module comprises an undercut at the second end portion to form a bubble entrapment chamber.

4. The phantom of claim 1, wherein the at least one perfusion module is couplable to an external fluid source and an external fluid drain that are both located outside of the phantom and during use fluid is able to flow from the external fluid source through the at least one perfusion module to the external fluid drain.

5. The phantom of claim 4, wherein the at least one perfusion module comprises a main body with first and second end portions and a plurality of rods with axes arranged along a longitudinal axis of the main body, each rod of the plurality of rods being dimensioned to define an amount of fluid flow or a rate of fluid passage through the perfusion module,
wherein the first end portion includes:
a first cap,
a first permeable plate with a first surface that is spaced apart from an inner surface of an end of the first cap to define a first reservoir therebetween and a second surface that faces the plurality of rods, and
a first tube connected to the first reservoir; and
wherein the second end portion includes:
a second cap with the connector on an outer surface thereof that is adapted to releasably engage the first surface of the at least one support plate;
a second permeable plate with a first surface that is spaced apart from an inner surface of an end of the second cap to define a second reservoir therebetween and a second surface that faces the plurality of rods; and
a second tube connected to the second reservoir,
wherein the first and second tubes are coupled to an exterior of the phantom to receive a fluid that flows through the perfusion module during MR imaging.

6. The phantom of claim 1, wherein the at least one anisotropic diffusion module has a scaffolding and at least one fiber network, where the plurality of locations comprises a plurality of apertures, the plurality of apertures providing positions for any termini, edges, and nodes of the at least one fiber network, wherein the nodes include bifurcations and/or intersections in fibers.

7. The phantom of claim 6, wherein the at least one anisotropic diffusion module has at least one support post, and the at least one support post comprises a body having first and second end portions, the first end portion having a first connector for releasable attachment to a first support post and the second end portion having a second connector to releasably attach to the first surface of the support plate or a second support post, where the at least one support post is releasably connected to the first surface of the at least one support plate and assembled to support the fiber network.

8. The phantom of claim 7, wherein the at least one element comprises at least one crossbar connector, the at least one crossbar connector comprising at least two end caps and a bar that connects to the at least two end caps where each end cap has a recess for receiving a free end portion of a single support post.

9. The phantom of claim 7, wherein the at least one fiber network comprises a fiber having at least one edge that is coupled to two support posts, the fiber edge having a thickness selected to provide anisotropic diffusion within a desired volume element during MR imaging.

10. The phantom of claim 6, wherein the at least one fiber network comprises two fiber edges that are coupled at a node, each fiber edge having a selected thickness.

11. The phantom of claim 6, wherein the at least one fiber network comprises a fiber, at least two termini, at least one additional node, at least one edge and optionally at least one bifurcation that are arranged according to a network structure that is selected based on a physiological nervous structure.

12. The phantom of claim 1, wherein the at least one support plate is an axial support plate that has an orientation that is parallel to a base of the phantom and/or wherein the at least one support plate is a vertical support plate that has an orientation that is perpendicular to the base of the phantom.

13. The phantom of claim 12, wherein the vertical support plate has a first fiber network attached to the first surface thereof and/or a second fiber network attached to a second surface thereof.

14. The phantom of claim 1, wherein the at least one support plate comprises a second surface that is opposite to the first surface, the second surface including a transformable machine-readable code pattern.

15. The phantom of claim 1, wherein the phantom comprises a lower plate for the outer housing and a plurality of spacers that engage a first set of recesses on an upper surface of the lower plate and a second set of recesses on the second surface of a given support plate that is closest to the lower plate for securing the given support plate to the outer housing of the phantom.

16. The phantom of claim 1, wherein the phantom comprises a plurality of support plates, where each support plate is connected to scaffolding and an associated fiber network, and at least two of the associated fiber networks have different network patterns or same network patterns each having different fiber materials and/or fiber arrangements for producing different fractional anisotropies.

17. The phantom of claim 1, wherein the outer housing comprises at least one port that is adapted to receive a medical device or a component of a medical device wherein during use the medical device or the component of the medical device is placed adjacent to a diffusion structure located on the at least one support plate in order to develop medical devices with desired imaging properties.

18. A method for creating an anisotropic diffusion network module for a phantom, wherein the method comprises:
(a) defining a network pattern and locating network elements including termini, at least one fiber edge, optionally at least one bifurcation, and optionally at least one intersection in the network pattern;
(b) defining relative positions of the network elements and connectivity between the network elements;
(c) defining any intersections between the network elements as being one of a touch point, a partially interweaving intersection and a complete interweaving intersection;
(d) optionally defining a relative weighting between at least two fiber edges connected through a bifurcation or intersection;
(e) defining the positions of the network elements using scaffolding elements positioned on a support plate and optionally including at least one isotropic diffusion module;
(f) defining an origin position using one of the scaffolding elements positioned on the support plate from which to begin assembly of a network pattern using a fiber material for making a model of the network; and
(g) building a fiber network by attaching a desired fiber material to the scaffolding element defining the origin position and weaving at least one strand of the fiber material around one or more of the scaffolding elements according to weaving instructions and the network pattern to form the anisotropic diffusion network module.

19. The method of claim 18, wherein the method comprises attaching the scaffolding elements and the fiber network along with a support plate to an interior surface of the phantom.

20. The method of claim 18, wherein the anisotropic diffusion network module is constructed to simulate diffusion properties that mimic a natural physiological structure or model a biological structure during MR imaging.

21. The method of claim 18, wherein the fiber material is a bicomponent fiber material which includes polymeric rods covered in a soluble material, and the method comprises:
   weaving strands of the fiber material around the one or more scaffolding elements to produce a first arrangement where fibers are spaced apart from one another in a z-direction,
   submerging the fiber network in water to dissolve the soluble material and optionally heating the water to about 30-40 degrees Celsius, and
   after dissolving the soluble material, collapsing the fibers into a second arrangement.

22. The method of claim 21, wherein after collapsing the fibers, the method comprises applying sheathing to the fiber network, applying tensioning to the fiber network and/or moving termini of the fiber network to produce a final arrangement for the fiber network.

23. A method for building a parametric model for representing DTI information of a nervous structure, wherein the method comprises:
   modelling a connected set of nervous structures using a mapping process based on steps (a) to (c) of claim 18 to create the parametric model by defining termini, edges with lengths, intersections, relative positions of intersections, intersection types, and a density of each network connection to represent the nervous structure;
   storing the parametric model; and
   using the parametric model to reduce a file size needed to store DWI or DTI information.

24. The method of claim 23, wherein the method further comprises using a series of parametric models, with different degrees of complexity at different distances from an area of interest, to reduce a file size needed to store DWI or DTI information.

* * * * *